(12) United States Patent
Kim

(10) Patent No.: US 10,249,601 B2
(45) Date of Patent: *Apr. 2, 2019

(54) FAN-OUT SEMICONDUCTOR PACKAGE MODULE

(71) Applicant: SAMSUNG ELECTRO-MECHANICS CO., LTD., Suwon-si, Gyeonggi-do (KR)

(72) Inventor: Won Gi Kim, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/928,745

(22) Filed: Mar. 22, 2018

(65) Prior Publication Data

US 2018/0211944 A1 Jul. 26, 2018

Related U.S. Application Data

(63) Continuation of application No. 15/800,951, filed on Nov. 1, 2017, now Pat. No. 9,978,731.

(30) Foreign Application Priority Data

Dec. 28, 2016 (KR) .......................... 10-2016-0181368
May 22, 2017 (KR) .......................... 10-2017-0063074

(51) Int. Cl.
*H01L 25/10* (2006.01)
*H01L 23/367* (2006.01)
(Continued)

(52) U.S. Cl.
CPC ............ *H01L 25/105* (2013.01); *H01L 23/13* (2013.01); *H01L 23/3128* (2013.01);
(Continued)

(58) Field of Classification Search
CPC ......... H01L 2224/02379; H01L 25/105; H01L 21/565; H01L 23/66; H01L 23/3128;
(Continued)

(56) References Cited

U.S. PATENT DOCUMENTS 8,975,726 B2 3/2015 Chen et al.
9,786,623 B2 10/2017 Lin
(Continued)

FOREIGN PATENT DOCUMENTS

KR 10-2011-0135629 A 12/2011
KR 10-2013-0085821 A 7/2013

OTHER PUBLICATIONS

Notice of Allowance issued in corresponding parent U.S. Appl. No. 15/800,951, dated Feb. 5, 2018.

*Primary Examiner* — Jasmine Clark
(74) *Attorney, Agent, or Firm* — Morgan Lewis & Bockius LLP

(57) ABSTRACT

A fan-out semiconductor package includes a first connection member having a through-hole, a semiconductor chip with connection pads on its active surface disposed in the through-hole and a first encapsulant encapsulating at least portions of the first connection member and the semiconductor chip. A second connection member is disposed below the first connection member and the semiconductor chip. A first heat dissipation member is formed in the first connection member. A component package is disposed on the fan-out semiconductor package and includes a wiring substrate connected to the first connection member through connection terminals, electronic components disposed on the wiring substrate, a second encapsulant encapsulating at least portions of the electronic components, and a second heat dissipation member formed in the wiring substrate. At least one of the electronic components is connected to the
(Continued)

first heat dissipation member through the second heat dissipation member.

17 Claims, 18 Drawing Sheets

(51) Int. Cl.
 *H01L 23/66* (2006.01)
 *H01L 23/31* (2006.01)
 *H01L 23/538* (2006.01)
 *H01L 23/00* (2006.01)
 *H01L 23/13* (2006.01)

(52) U.S. Cl.
 CPC ...... *H01L 23/3677* (2013.01); *H01L 23/5383* (2013.01); *H01L 23/5386* (2013.01); *H01L 23/5389* (2013.01); *H01L 23/66* (2013.01); *H01L 24/20* (2013.01); *H01L 2224/214* (2013.01); *H01L 2225/1035* (2013.01); *H01L 2225/1058* (2013.01); *H01L 2225/1094* (2013.01)

(58) Field of Classification Search
 CPC ............. H01L 23/3677; H01L 23/5386; H01L 23/5389; H01L 24/20; H01L 23/5383; H01L 2225/1058; H01L 2225/1035; H01L 2225/214; H01L 2225/1094
 See application file for complete search history.

(56) References Cited

U.S. PATENT DOCUMENTS

| | | | |
|---|---|---|---|
| 9,978,731 | B1* | 5/2018 | Kim ................ H01L 25/105 |
| 2011/0304035 | A1 | 12/2011 | Kim et al. |
| 2013/0187288 | A1 | 7/2013 | Hong et al. |
| 2014/0103527 | A1 | 4/2014 | Marimuthu et al. |
| 2016/0276307 | A1 | 9/2016 | Lin |

* cited by examiner

I-I'

US 10,249,601 B2

FAN-OUT SEMICONDUCTOR PACKAGE MODULE

CROSS-REFERENCE TO RELATED APPLICATION(S)

This application is a continuation of U.S. patent application Ser. No. 15/800,901 filed on Nov. 1, 2017, now U.S. Pat. No. 9,978,731, which claims benefit of priority to Korean Patent Application Nos. 10-2016-0181368 filed on Dec. 28, 2016 and 10-2017-0063074 filed on May 22, 2017 in the Korean Intellectual Property Office, the disclosure of which are incorporated herein by reference in their entirety.

TECHNICAL FIELD

The present disclosure relates to a semiconductor package module, and more particularly, to a fan-out semiconductor package module in which connection terminals may extend outwardly of a region in which a semiconductor chip is disposed.

BACKGROUND

In recent electronic devices, various types of technology have been implemented in an attempt to reduce the sizes of the electronic devices, and packaging method for attaching an integrated circuit (IC) to a printed circuit board has also been variously changed. Meanwhile, similar to existing IC packaging techniques such as a ball grid array (BGA), a wafer level chip-scale package (WLCSP), or the like, a circuit having a three-dimensional structure in a package-on-package (POP) form in order to reduce a size of an overall circuit has been used.

Current POP technology uses a relatively complicated method of forming holes in a mold using laser drilling in a general BGA substrate, or the like, and connecting the substrate to an upper circuit using solders, or the like. The complexity results in reduced yield and there is a risk that new investment will occur. In addition, it is difficult to effectively transfer heat generated by the upper circuit stacked on the substrate to the substrate. The inefficient heat transfer result in insufficient temperature, thereby limiting the types of IC that may be stacked. Efficiency at the time of an operation is also reduced.

SUMMARY

An aspect of the present disclosure may provide a fan-out semiconductor package module in which a circuit area may be significantly reduced, without special limitations or issues of reliability, while heat dissipation performance may be improved.

According to an aspect of the present disclosure, a fan-out semiconductor package module maybe provided, in which a connection member having a through-hole in which a semiconductor chip is disposed and electrically connected to the semiconductor package is introduced into a lower package, and a heat dissipation member for improving heat dissipation performance is formed in the through-hole or the connection member and is connected to a heat dissipation member of an upper package.

According to an aspect of the present disclosure, a fan-out semiconductor package module may include: a fan-out semiconductor package including a first connection member having a through-hole, a semiconductor chip disposed in the through-hole of the first connection member and a first encapsulant encapsulating at least portions of the first connection member and the semiconductor chip. The semiconductor chip has an active surface and an inactive surface opposing the active surface, the active surface having connection pads disposed on the active surface. The fan-out package further includes a second connection member disposed below the first connection member and the semiconductor chip, and a first heat dissipation member formed in the first connection member or the through-hole, the first connection member and the second connection member each including redistribution layers electrically connected to the connection pads of the semiconductor chip. The fan-out semiconductor package module further includes a component package disposed on the fan-out semiconductor package, the component package including a wiring substrate connected to the first connection member through connection terminals, a plurality of electronic components disposed on the wiring substrate, a second encapsulant encapsulating at least portions of the plurality of electronic components, and a second heat dissipation member formed in the wiring substrate. At least one of the plurality of electronic components of the component package is connected to the first heat dissipation member through the second heat dissipation member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular embodiment, even if it is not described in another embodiment, maybe understood as a description related to another embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. The terms "first," "second," etc. may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

In the present disclosure, terms "lower side", "lower portion", "lower surface", and the like, have been used to indicate a direction toward a mounted surface of the semiconductor device in relation to cross sections of the drawings, terms "upper side", "upper portion", "upper surface", and the like, have been used to indicate an opposite direction to the direction indicated by the terms "lower side", "lower portion", "lower surface", and the like. However, these directions are defined for convenience of explanation, and the claims are not particularly limited by the directions defined as described above.

Terms used herein are used only to describe an embodiment rather than limiting the present disclosure. In this case, singular forms include plural forms unless interpreted otherwise in context.

Electronic Device

Figure 1:
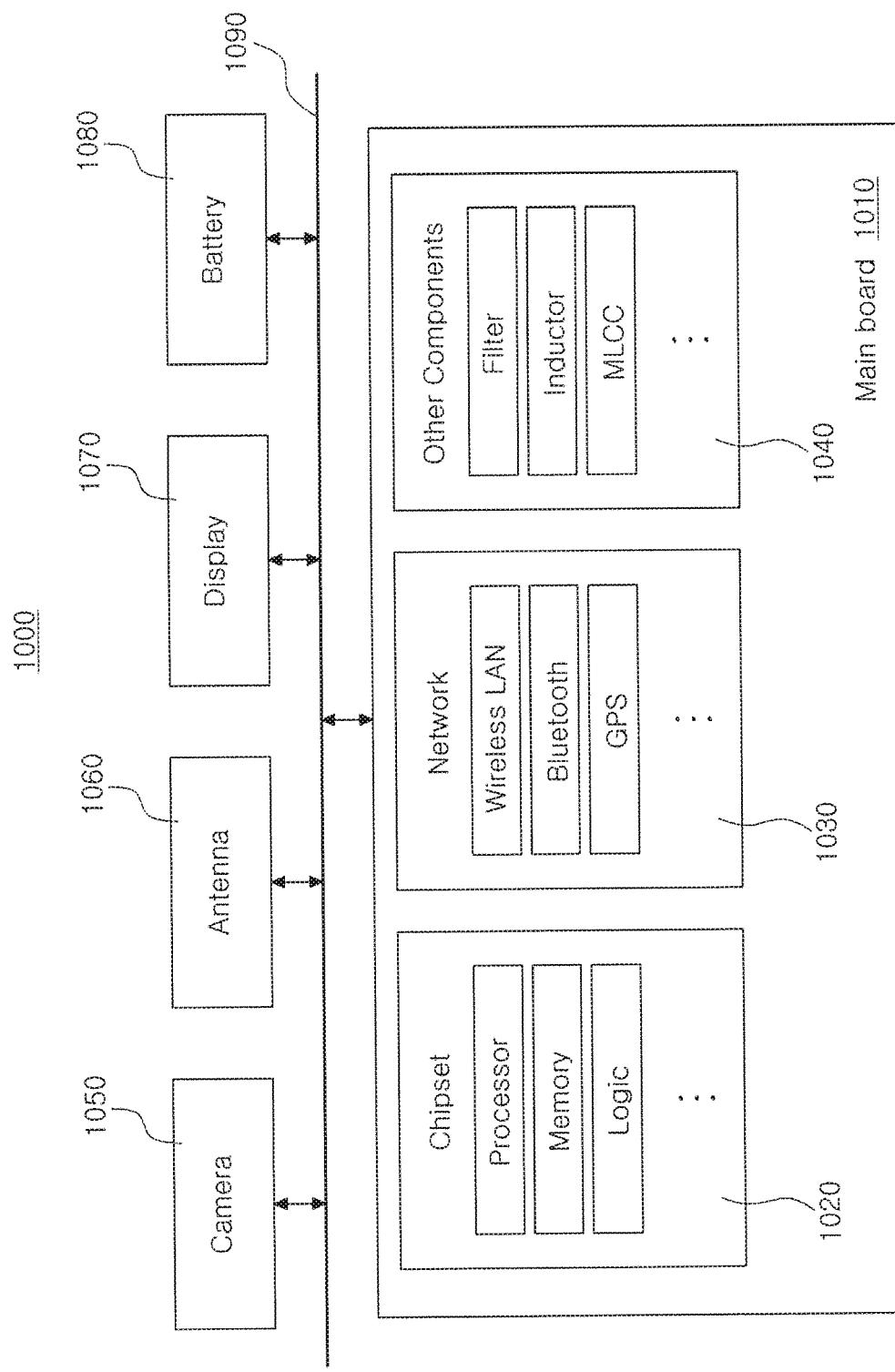
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected to main board 1010. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as, for example, a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as, for example, wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include, without limitation, a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be, for example, a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
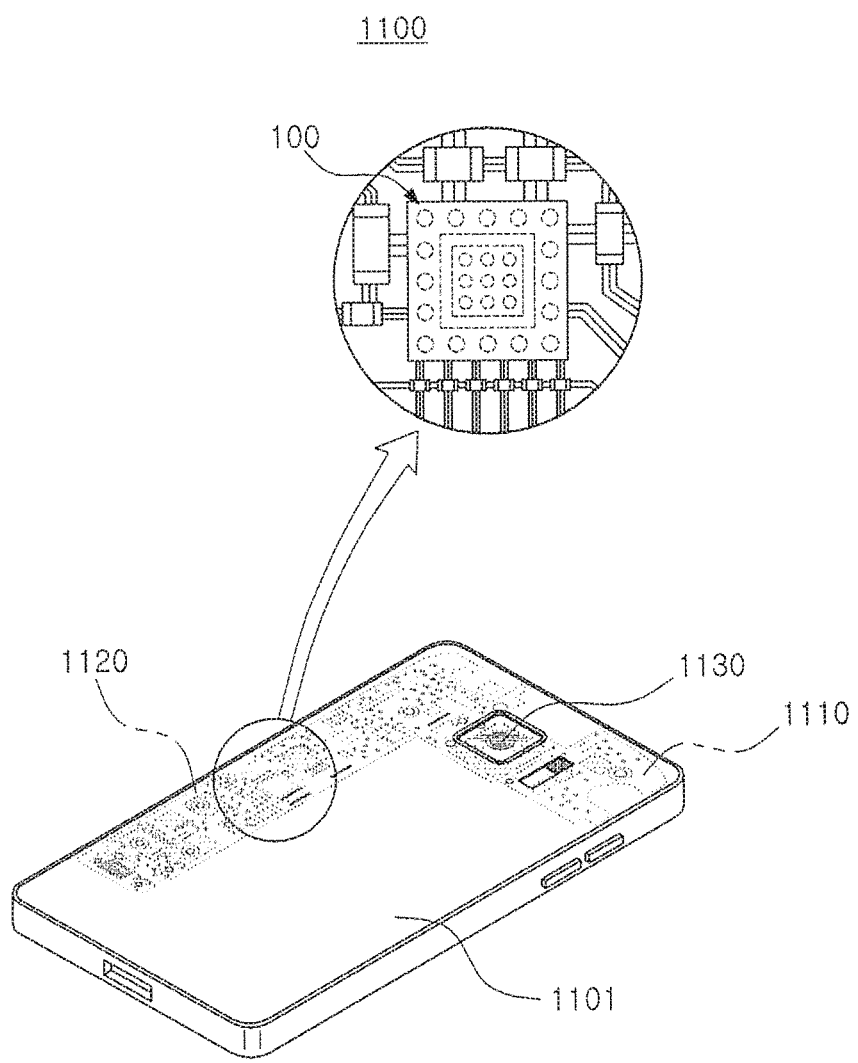
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101.

Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board may be desirable.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
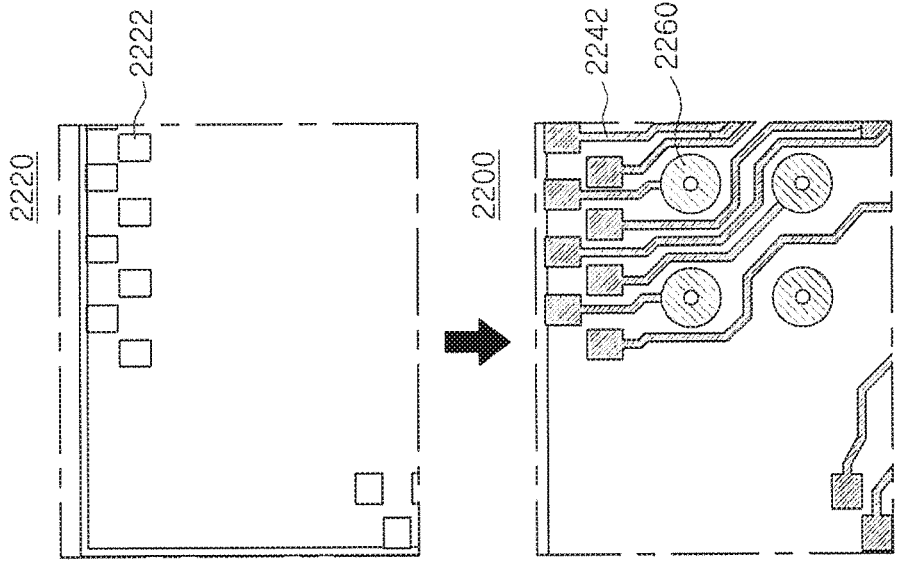
FIGS. 3A and 3B are schematic cross-sectional views illustrating states of a fan-in semiconductor package before and after being packaged.
Figure 3A:
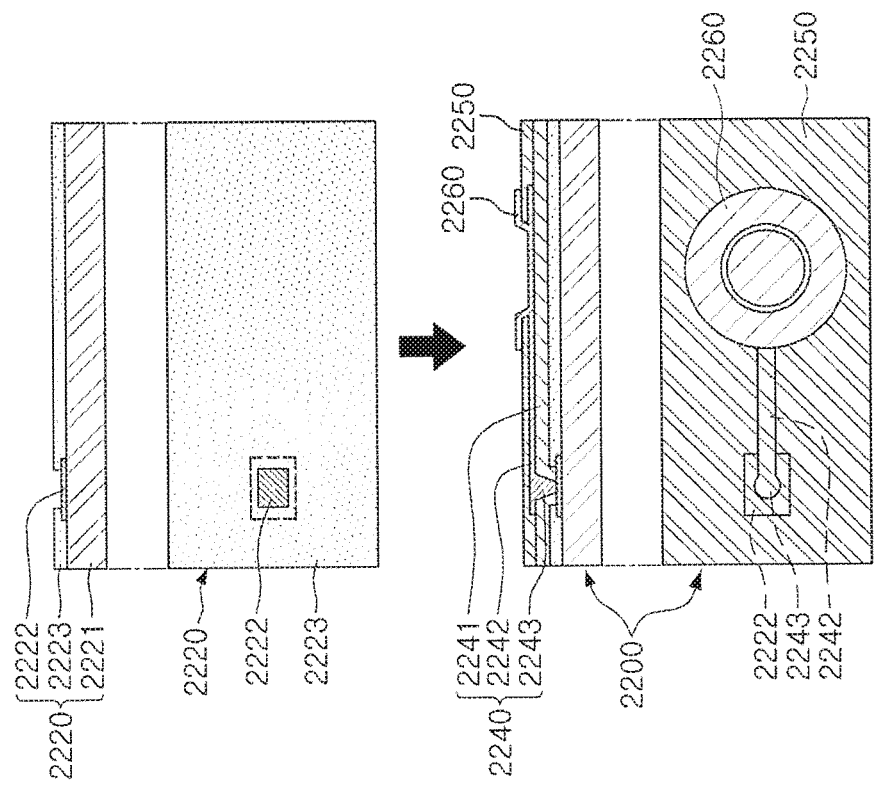

FIGS. 3A and 3B are schematic cross-sectional views illustrating states of a fan-in semiconductor package before and after being packaged.

Figure 4:
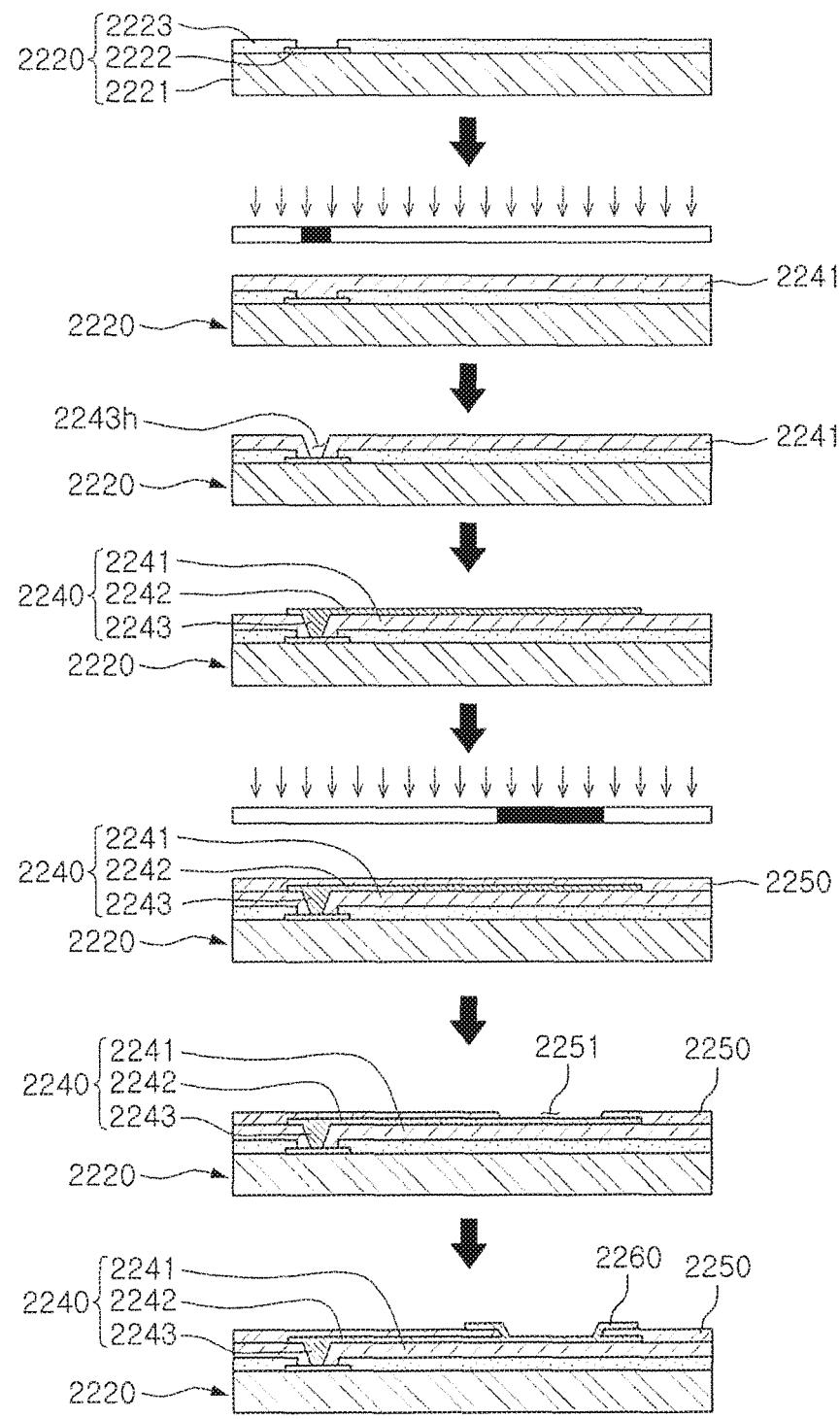
FIG. 4 is schematic cross-sectional view illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including, without limitation, silicon (Si), germanium (Ge), gallium arsenide (GaAs), or the like, connection pads 2222 formed on one surface of the body 2221 and including a conductive material such as, for example, aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed, depending on a size of the semiconductor chip 2220, on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the issues described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
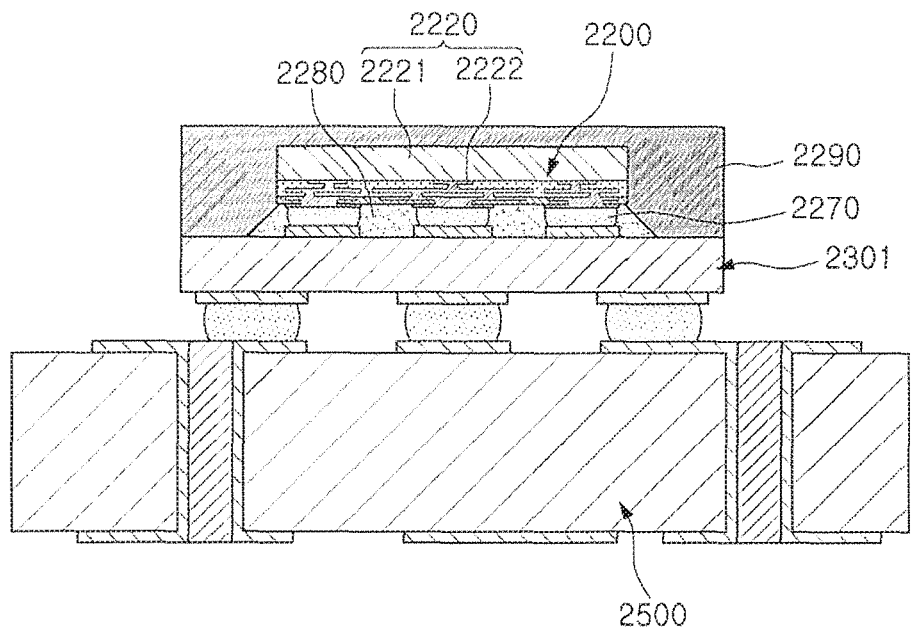
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
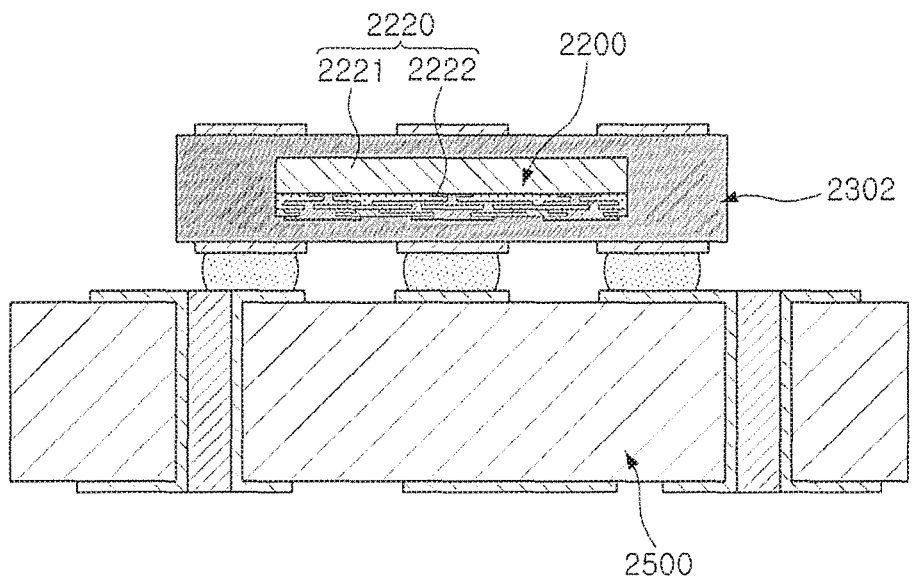
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301.

In this case, solder balls 2270, and the like, may be fixed by an underfill resin 2280, or the like, and an outer side of the semiconductor chip 2220 maybe covered with a molding material 2290, or the like. Alternatively, a fan-in semiconductor package 2200 maybe embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-out Semiconductor Package

Figure 7:
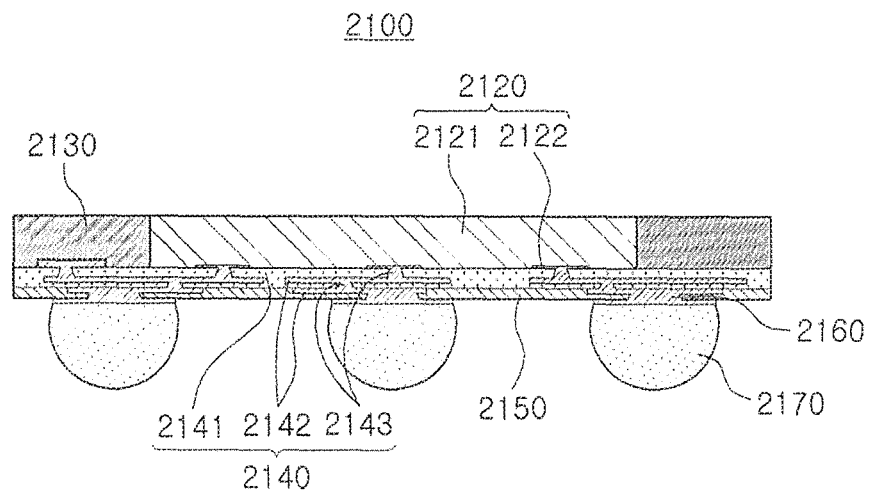
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 maybe further formed in openings of the passivation layer 2150. Solder balls 2170 may be further formed on the underbump metal layer 2160. The semiconductor chip 2120 maybe an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
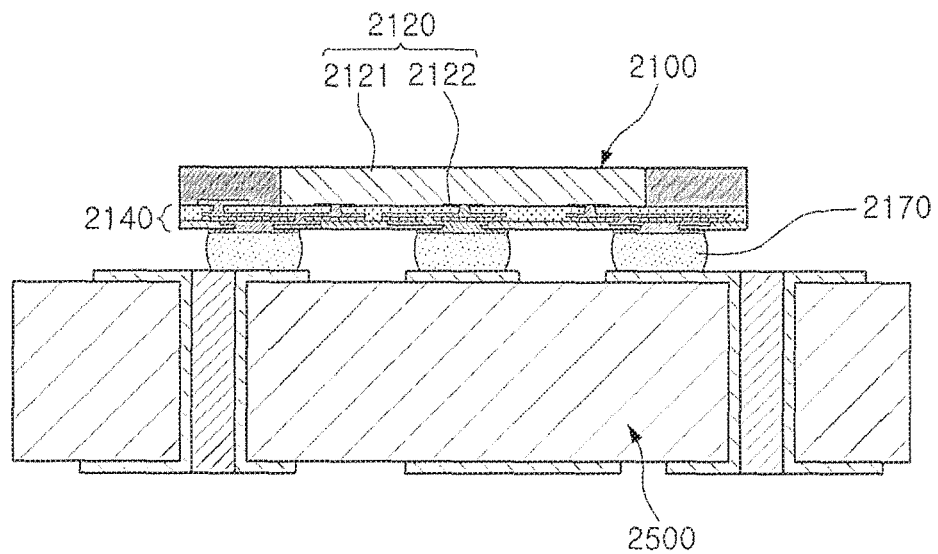
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product.

Therefore, the fan-out semiconductor package may be implemented in a form more compact than that of a general package-on-package (POP) type semiconductor package using a printed circuit board (PCB), and may solve a problem due to occurrence of a warpage phenomenon.

The fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Semiconductor Package Module

Figure 9:
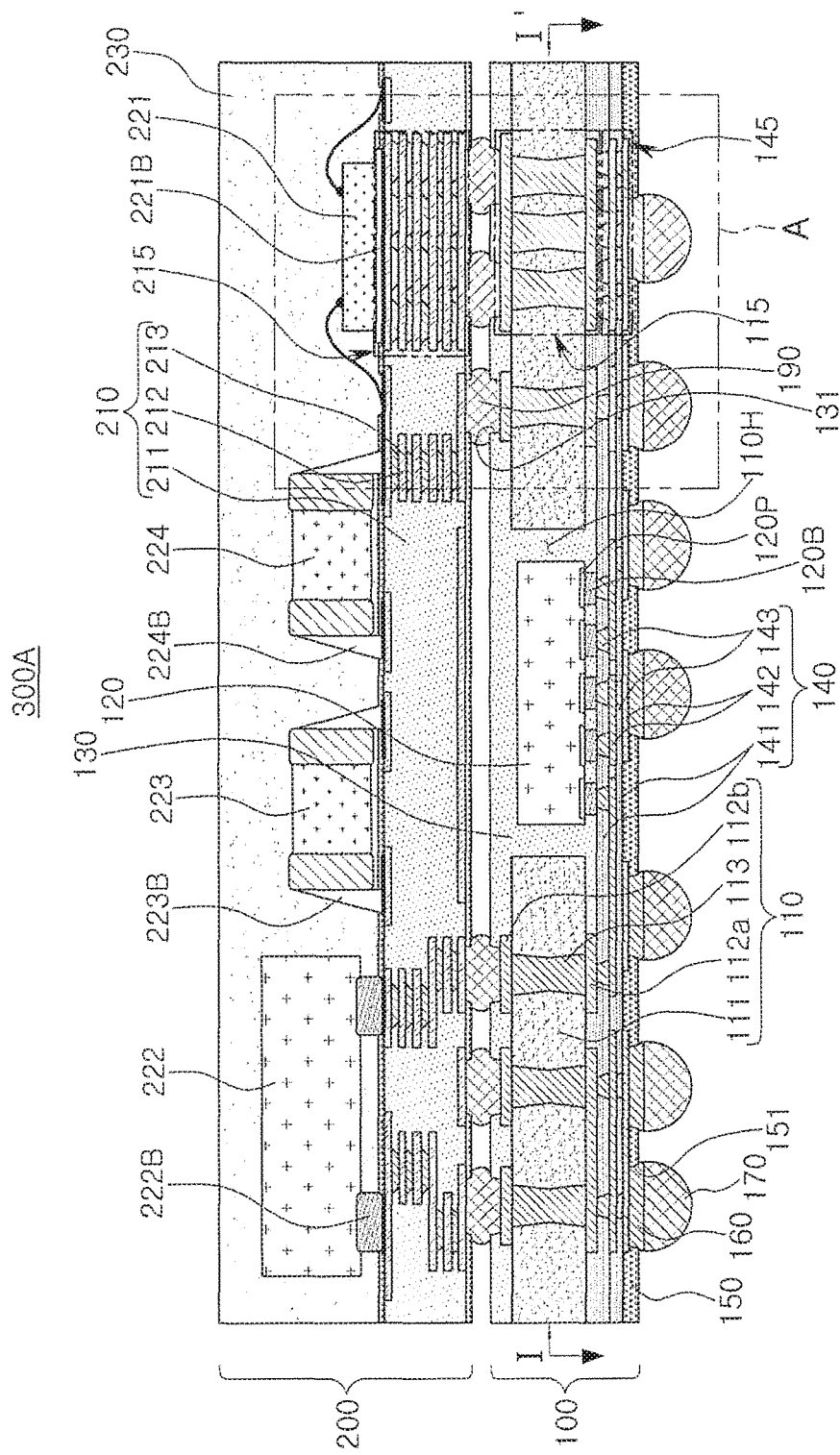
FIG. 9 is a schematic cross-sectional view illustrating an example of a fan-out semiconductor package module.

FIG. 9 is a schematic cross-sectional view illustrating an example of a fan-out semiconductor package module.

Figure 10:
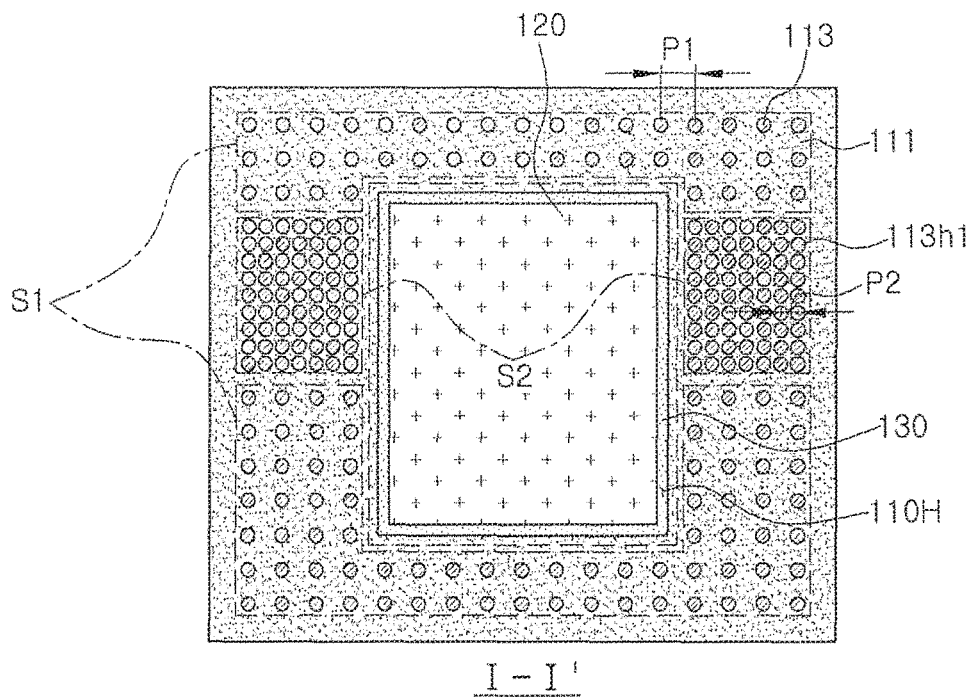
FIG. 10 is a plan view taken along line I-I' of the fan-out semiconductor package module of FIG. 9.

FIG. 10 is a plan view taken along line I-I' of the fan-out semiconductor package module of FIG. 9.

Figure 11A:
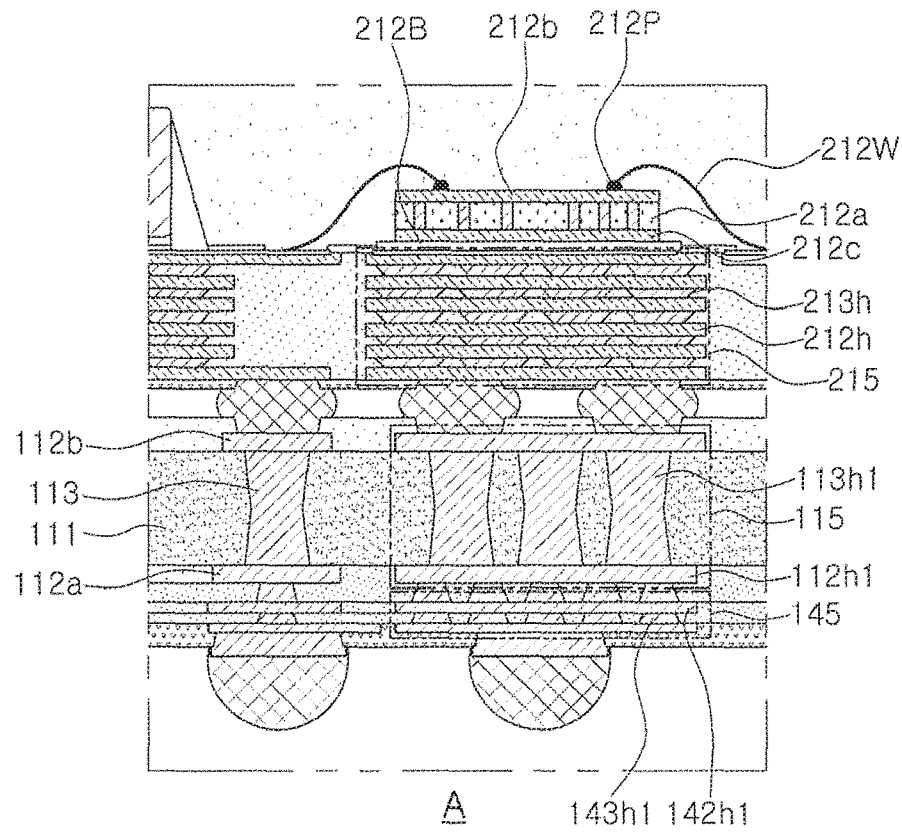
FIG. 11A is an enlarged view illustrating region A of the fan-out semiconductor package module of FIG. 9.

FIG. 11A is an enlarged view illustrating region A of the fan-out semiconductor package module of FIG. 9.

Referring to the drawings, a fan-out semiconductor package module 300A according to an embodiment in the present disclosure may include a fan-out semiconductor package 100 and a component package 200 disposed on the fan-out semiconductor package 100. The fan-out semiconductor package 100 may include a first connection member 110 having a through-hole 110H, a semiconductor chip 120 disposed in the through-hole 110H and having an active surface having connection pads 120P disposed thereon and an inactive surface opposing the active surface, a first encapsulant 130 encapsulating at least portions of the first connection member 110 and the semiconductor chip 120, and a second connection member 140 disposed on the first connection member 110 and the active surface of the semiconductor chip 120. The component package 200 may include a wiring substrate 210 disposed on the second connection member 140 and connected to the first connection member 110 through connection terminals 190, a plurality of electronic components 221, 222, 223, and 224 disposed on the wiring substrate 210, and a second encapsulant 230 encapsulating at least portions of the plurality of electronic components 221, 222, 223, and 224. The first connection member 110 may include redistribution layers 112a and 112b electrically connected to the connection pads 120P of the semiconductor chip 120. The second connection member 140 may also include redistribution layers 142 electrically connected to the connection pads 120P of the semiconductor chip 120. A first heat dissipation member 115 may be disposed in the first connection member 110. A second heat dissipation member 215 may be disposed in the wiring substrate 210. A third heat dissipation member 145 may be disposed in the second connection member 140. At least one 221 of the plurality of electronic components 221, 222, 223, and 224 may be connected to the second heat dissipation member 215, and may also be connected to the first heat dissipation member 115 through the second heat dissipation member 215. In addition, at least one, e.g., 221, of the plurality of electronic components 221, 222, 223, and 224 may also be connected to the third heat dissipation member 145 through the first heat dissipation member 115.

The fan-out semiconductor package module 300A according to an embodiment may have a structure in which the fan-out semiconductor package 100 is introduced, a main semiconductor chip 120 such as ICs is mounted in the fan-out semiconductor package 100, the component package is introduced onto the fan-out semiconductor package 100, and various electronic components 221, 222, 223, and 224 are mounted in the component package. Therefore, a micro fan-out semiconductor package module may be provided without having special limitations or a reliability issue. In addition, in the fan-out semiconductor package 100, the first connection member 110 in which the redistribution layers 112a and 112b, and the like, are formed is introduced in the surrounding of the semiconductor chip 120, and first connection terminals 170 electrically connected to the first encapsulant 130 are introduced below the first encapsulant 130, such that the fan-out semiconductor package module 300A may be stably mounted on a main board, or the like, of an electronic device. In addition, the fan-out semiconductor package 100 may include the first heat dissipation member 115 formed in the first connection member 110 and the third heat dissipation member 145 formed in the second connection member 140, and the component package 200 may include the second heat dissipation member 215 formed in the wiring substrate 210. The electronic component, e.g., 221, generating a large amount of heat among the plurality of electronic components 221, 222, 223, and 224, may be connected to the first heat dissipation member 115, the second heat dissipation member 215, and the third heat dissipation member 145. That is, the electronic component 221 generating the large amount of heat may be selectively connected to the heat dissipation members 115, 215, and 145, and heat may be effectively dissipated downwardly of the fan-out semiconductor package module 300A through such a path.

The respective components included in the fan-out semiconductor package module according to an embodiment will hereinafter be described in more detail.

The first connection member 110 may provide an electrical path so that the fan-out semiconductor package 100 may be used in the fan-out semiconductor package module 300A having a package-on-package (PoP) form. In addition, the first connection member 110 may be advantageous to maintain rigidity of the fan-out semiconductor package 100 depending on certain materials, and may be advantageous to maintain uniformity of thickness of the first encapsulant 130. In addition, the first connection member 110 may provide a routing region in which the redistribution layers 112a and 112b may be formed, resulting in reducing the number of layers of the second connection member 140 and solving a defect occurring in a process of forming the second connection member 140. The first connection member 110 may have the through-hole 110H. The semiconductor chip 120 may be disposed in the through-hole 110H to be spaced apart from the first connection member 110 by a predetermined distance. For example, side surfaces of the semiconductor chip 120 may be surrounded by the first connection member 110. However, the first connection member 110 is not limited thereto. The first connection member 110 may include an insulating layer 111, first and second redistribution layers 112a and 112b disposed on a lower surface and an upper surface of the insulating layer 111, respectively, and first vias 113 penetrating through the insulating layer 111 and electrically connecting the first and second redistribution layers 112a and 112b to each other.

An insulating material may be used as a material of the insulating layer 111. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg, Ajinomoto Build up Film (ABF), FR-4, Bismaleimide Triazine (BT), or the like.

The first and second redistribution layers 112a and 112b may serve as redistribution patterns, and material of each of the first and second redistribution layers 112a and 112b may be a conductive material such as, for example, copper (Cu), aluminum (Al), silver (Ag), tin (Sn), gold (Au), nickel (Ni), lead (Pb), titanium (Ti), or alloys thereof. The first and second redistribution layers 112a and 112b may perform various functions depending on designs of their corresponding layers. For example, the first and second redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first and second redistribution layers 112a and 112b may include via pads, connection terminal pads, and the like.

The first vias 113 may electrically connect the first and second redistribution layers 112a and 112b formed on different layers to each other, resulting in a path in the first connection member 110. Material of each of the first vias 113 may be a conductive material such as, for example, copper (Cu), aluminum (Al), silver (Ag), tin (Sn), gold (Au), nickel (Ni), lead (Pb), titanium (Ti), or alloys thereof. Each of the first vias 113 may be completely filled with the conductive material, or the conductive material may be formed along a wall of each of via holes unlike illustrated in the drawings. In addition, each of the first vias 113 may have all of the known vertical cross-sectional shapes such as a tapered shape, a cylindrical shape, or the like, and may have any convex horizontal cross-sectional shape including, without limitation, circle, regular or irregular polygon, or a closed conic section.

The first heat dissipation member 115 may be connected to the specific electronic component 221 generating relatively large amount of heat among the plurality of electronic components 221, 222, 223, and 224 mounted in the component package 200 through the second heat dissipation member 215. In addition, the first heat dissipation member 115 may also be connected to the third heat dissipation member 145 formed in the second connection member 140. That is, heat generated by the specific electronic component 221 generating relatively large amount of heat may be effectively dissipated downwardly of the fan-out semiconductor package module 300A through the first to third heat dissipation members 115, 215, and 145. The first to third heat dissipation members 115, 215, and 145 may be disposed to overlap the electronic component 221 when viewed from above or below the fan-out semiconductor package module 300A. In this case a heat dissipation path may be significantly shortened to more effectively dissipate the heat.

The first heat dissipation member 115 may include a plurality of second vias 113$h$1 formed in a region different from a region in which the plurality of first vias 113 are formed in the first connection member 110 and connected to the second heat dissipation member 215 and the third heat dissipation member 145, and pads 112$h$1 for second vias formed on upper and lower surfaces of the plurality of second vias 113$h$1 and connected to the plurality of second vias 113$h$1. If P1 is a pitch between the plurality of first vias 113 and P2 is a pitch between the plurality of second vias 113$h$1, the vias are spaced such that condition P1>P2 is satisfied. In addition, if S1 is an area of the region in which the plurality of first vias 113 of the first connection member 110 are formed and S2 is an area of the region in which the plurality of second vias 113$h$1 are formed, the vias are formed to satisfy the condition that S1>S2. That is, the plurality of second vias 113$h$1, heat dissipation paths formed in a specific region, may be formed at a density higher than that of the plurality of first vias 113 for connection of signals, and the like, in a region narrower than the region in which the plurality of first vias 113 are formed. In this case, the fan-out semiconductor package module may have high heat dissipation efficiency and have a high degree of freedom in a circuit design. Each of the plurality of second vias 113$h$1 and the pads 112$h$1 for second vias may include a conductive material such as, for example, copper (Cu), aluminum (Al), silver (Ag), tin (Sn), gold (Au), nickel (Ni), lead (Pb), titanium (Ti), or alloys thereof.

The semiconductor chip 120 may be an integrated circuit (IC) in a bare state, having several hundred to several million elements integrated in a single chip. The integrated circuit (IC) may be, for example, a transceiver IC, but is not limited thereto. The semiconductor chip 120 may include a body on which various circuits are formed, and the connection pads 120P may be formed on an active surface of the body. The body may be formed on the basis of, for example, an active wafer. In this case, silicon (Si), germanium (Ge), gallium arsenide (GaAs), or the like, may be used as a basic material of the body. The connection pads 120P may electrically connect the semiconductor chip 120 to other components, and material of each of the connection pads 120P may be a conductive material such as aluminum (Al), but is not limited thereto. The active surface of the semiconductor chip 120 refers to a surface of the semiconductor chip 120 on which the connection pads 120P are disposed, and the inactive surface of the semiconductor chip 120 refers to a surface of the semiconductor chip 120 opposing the active surface. As an example, the semiconductor chip 120 may be disposed in a face-down form. That is, the active surface on which the connection pads 120P are disposed may be disposed in a downward direction in which the second connection member 140 is disposed. A passivation layer exposing at least portions of the connection pads 120P may be formed on the active surface, if necessary. The semiconductor chip 120 may be connected to the second connection member 140 through bumps 120B including, for example, a solder, a metal, or the like. However, the bumps 120B may be omitted, if necessary.

The first encapsulant 130 may be configured to protect the first connection member 110 and the semiconductor chip 120. An encapsulation form of the first encapsulant 130 is not particularly limited, but may be a form in which the first encapsulant 130 surrounds at least portions of the first connection member 110 and the semiconductor chip 120. For example, the first encapsulant 130 may cover upper portions of the first connection member 110 and the semiconductor chip 120, and fill a space of the through-hole 110H. Material of the first encapsulant 130 is not particularly limited, but may be, for example, an insulating material. In more detail, the material of the first encapsulant 130 may be, for example, ABF, or the like, that includes an inorganic filler and an insulating resin, but does not include a glass fiber, but is not limited thereto. That is, a material including a glass fiber, an inorganic filler, and an insulating resin may be used as the material of the first encapsulant 130, if necessary.

The second connection member 140 may be configured to redistribute the connection pads 120P of the semiconductor chip 120. Several tens to several hundreds of connection pads 120P having various functions may be primarily redistributed by the second connection member 140. The second connection member 140 may be disposed below the first connection member 110 and the semiconductor chip 120. The second connection member 140 may include insulating layers 141, redistribution layers 142 disposed on the insulating layers 141, and vias 143 penetrating through the insulating layers 141 and connecting the redistribution layers 142 to each other. The second connection member 140 may include a larger number of layers than that of layers illustrated in the drawings or may include one layer.

Material of each of the insulating layers 141 may be an insulating material. In this case, a photosensitive insulating material such as a PID resin may also be used as the insulating material. In this case, the insulating layers 141 may be formed to have a smaller thickness, and a fine pitch of the vias 143 may be achieved more easily. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 120P. Material of each of the redistribution layers 142 may be a conductive material such as, for example, copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 120P, or the like, formed on different layers to each other, resulting in a path in the fan-out semiconductor package 100. Material of each of the vias 143 may be a conductive material such as, for example, copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the known shapes such as a tapered shape, a cylindrical shape, and the like and may have any convex horizontal cross-sectional shape including, without limitation, circle, regular or irregular polygon, or a closed conic section.

The third heat dissipation member 145 may be connected to the specific electronic component 221 generating a relatively large amount of heat among the plurality of electronic components 221, 222, 223, and 224 mounted in the component package 200 through the first heat dissipation member 115 and the second heat dissipation member 215. That is, the heat generated by the specific electronic component 221 generating the relatively large amount of heat may be effectively dissipated downwardly of the fan-out semiconductor package module 300A through the first to third heat dissipation members 115, 215, and 145. The first to third heat dissipation members 115, 215, and 145 may be disposed to overlap each other when viewed in the upward and downward directions of the fan-out semiconductor package module 300A. In this case the heat dissipation path may be significantly shortened to more effectively dissipate the heat.

The third heat dissipation member 145 may include a plurality of stacked vias 143$h$1. The plurality of stacked vias 143$h$1 may be connected to each other through pads 142$h$1 for stacked vias. A pitch between the plurality of stacked vias 143$h$1 of the third heat dissipation member 145 may be narrower than that between the vias 143 for signal connection, or the like, of the second connection member 140. In addition, an area of a region in which the plurality of stacked vias 143$h$1 of the third heat dissipation member 145 are formed may be smaller than that of a region in which the vias 143 for signal connection, or the like, of the second connection member 140 are formed. In this case, the fan-out semiconductor package module may have high heat dissipation efficiency and have a high degree of freedom in a circuit design. Each of the plurality of stacked vias 143$h$1 and the pads 142$h$1 for stacked vias of the third heat dissipation member 145 may include a conductive material such as, for example, copper (Cu), aluminum (Al), silver (Ag), tin (Sn), gold (Au), nickel (Ni), lead (Pb), titanium (Ti), or alloys thereof.

A passivation layer 150 having openings 151 exposing at least portions of the redistribution layer 142 of the second connection member 140 may be disposed below the second connection member 140. Material of the passivation layer 150 is not particularly limited, but may be, for example, a photosensitive insulating material such as a PID resin. Alternatively, a solder resist may also be used as the material of the passivation layer 150. Alternatively, an insulating material that includes an inorganic filler and an insulating resin, but does not include a glass fiber, for example, ABF, or the like, may be used as a material of the passivation layer 150.

An underbump metal layer 160 may be formed in the openings 151 of the passivation layer 150. The underbump metal layer 160 may improve connection reliability of the first connection terminals 170 and improve board level reliability of the fan-out semiconductor package module 300A. The underbump metal layer 160 may be connected to the redistribution layer 142 of the second connection member 140 exposed through the openings 151 of the passivation layer 150. In addition, the underbump metal layer 160 may also be connected to the pads 142$h$1 for stacked vias of the third heat dissipation member 145 exposed through the openings 151 of the passivation layer 150. The underbump metal layer 160 may be formed by a known metallization method using a known conductive material such as a metal, but is not limited thereto.

The first connection terminals 170 may be configured to connect the fan-out semiconductor package module 300A to the main board, or the like, of the electronic device. Each of the first connection terminals 170 may be formed of a conductive material such as, for example, a solder, or the like. However, this is only an example, and material of each of the first connection terminals 170 is not particularly limited thereto. Each of the first connection terminals 170 may be a plate, a ball, a pin, or the like. The first connection terminals 170 may be formed as a multilayer or single layer structure. When the first connection terminals 170 are formed as a multilayer structure, the first connection terminals 170 may include, for example, a copper (Cu) pillar and a solder. When the first connection terminals 170 are formed as a single layer structure, the first connection terminals 170 may include, without limitation, a tin-silver solder or copper (Cu). However, the first connection terminals 170 are not limited thereto. At least one of the first connection terminals 170 may be connected to the first to third heat dissipation members 115, 215, and 145, and when at least one of the first connection terminals 170 is connected to the main board, or the like, at least one of the first connection terminals 170 may effectively dissipate heat transferred through the first to third heat dissipation members 115, 215, and 145 to the main board. At least one of the first connection terminals 170 may be disposed in a fan-out region.

The second connection terminals 190 may be configured to connect the fan-out semiconductor package 100 and the component package 200 to each other. The second connection terminals 190 may be connected to portions of the second redistribution layer 112$b$ of the first connection member 110 exposed through openings 131 formed in the first encapsulant 130. Each of the second connection terminals 190 may be, for example, a solder ball, a copper (Cu) cored ball, a copper post, or the like, but is not limited thereto. Each of the second connection terminals 190 may have a size smaller than that of each of the first connection terminals 170.

Although not illustrated in the drawings, a metal layer may be further disposed on an inner wall of the through-hole 110H of the first connection member 110, if necessary. That is, the side surfaces of the semiconductor chip 120 and the first heat dissipation member 115 may also be surrounded by the metal layer (not illustrated). Heat generated by the semiconductor chip 120 maybe effectively dissipated upwardly or downwardly of the fan-out semiconductor package 100 through the metal layer (not illustrated), and electromagnetic waves may be effectively blocked through the metal layer (not illustrated). In addition, if necessary, a plurality of semiconductor chips 120 may be disposed in the through-hole 110H of the first connection member 110, and the number of through-holes 110H of the first connection member 110 may be plural and semiconductor chips 120 may be disposed in the through-holes, respectively. In addition, separate passive components such as a condenser, an inductor, and the like, may be disposed side by side with the semiconductor chip 120 in the through-hole 110H.

The wiring substrate 210 may be a known printed circuit board (PCB) such as an interposer substrate. The wiring substrate 210 may include an insulating layer 211 and wiring layers 212 and vias 213 formed in the insulating layer 211. Although not illustrated in detail in the drawings, various kinds of wiring layers 212 may be formed in the insulating layer 211.

The insulating layer 211 may include an insulating material. In this case, the insulating material may be, for example, a thermosetting resin such as an epoxy resin, a thermoplastic resin such as a polyimide resin, or a material having a reinforcing material such as a glass fiber or an inorganic filler together with the thermosetting resin and the thermoplastic resin, for example, prepreg, ABF, FR-4, BT, or the like. Alternatively, a PID resin may also be used as the insulating material. The insulating layers 211 may be multiple layers, and boundaries between the insulating layers 211 may be apparent or may not be apparent depending on their materials.

The wiring layers 212 may serve as redistribution patterns, and material of each of the wiring layers 212 may be a conductive material such as, for example, copper (Cu), aluminum (Al), silver (Ag), tin (Sn), gold (Au), nickel (Ni), lead (Pb), titanium (Ti), or alloys thereof. The wiring layers 212 may perform various functions depending on designs of their corresponding layers. For example, the wiring layers 212 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212 may include via pads, connection terminal pads, and the like. The wiring layers 212 may also be multiple layers.

The vias 213 may electrically connect the wiring layers 212 formed on different layers to each other. Material of each of the vias 213 may be a conductive material such as, for example, copper (Cu), aluminum (Al), silver (Ag), tin (Sn), gold (Au), nickel (Ni), lead (Pb), titanium (Ti), or alloys thereof. The each of vias 213 may be completely filled with the conductive material, or the conductive material may also be formed along a wall of each of the vias. In addition, each of the vias 213 may have all of the known shapes such as a tapered shape, a cylindrical shape, and the like. The vias 213 may also be formed as a multiple layer structure.

The second heat dissipation member 215 may be connected to the electronic component 221 generating the large amount of heat among the plurality of electronic components 221, 222, 223, and 224 to dissipate the heat downwardly of the fan-out semiconductor package module 300A through the first heat dissipation member 115 and the third heat dissipation member 145. The first to third heat dissipation members 115, 215, and 145 may be disposed to overlap each other when viewed in the upward and downward directions of the fan-out semiconductor package module 300A. In this case the heat dissipation path may be significantly reduced to more effectively dissipate the heat. The second heat dissipation member 215 may include a plurality of stacked vias 213h. The plurality of stacked vias 213h may be connected to each other through pads 212h for stacked vias. A pitch between the plurality of stacked vias 213h of the second heat dissipation member 215 may be narrower than that between the vias 213 for signal connection, or the like, of the wiring substrate 210. In addition, an area of a region in which the plurality of stacked vias 213h of the second heat dissipation member 215 are formed may be smaller than that of a region in which the vias 213 for signal connection, or the like, of the wiring substrate 210 are formed. In this case, the fan-out semiconductor package module may have high heat dissipation efficiency and have a high degree of freedom in a circuit design. Each of the plurality of stacked vias 213h and the pads 212h for stacked vias of the second heat dissipation member 215 may include a conductive material such as, for example, copper (Cu), aluminum (Al), silver (Ag), tin (Sn), gold (Au), nickel (Ni), lead (Pb), titanium (Ti), or alloys thereof.

The electronic components 221, 222, 223, and 224 may be various kinds of electronic components. For example, the electronic components 221, 222, 223, and 224 may be various kinds of active components, passive components, or the like. As a non-restrictive example, a first electronic component 221 may be a power amplifier (PA). The power amplifier 221 may include a body 221a having circuits formed therein, connection pads 221P disposed on the body, and vias 221v penetrating through the body. The connection pads 221P of the power amplifier 221 may be electrically connected to the wiring substrate 210 through wire bonding 221w. A lower surface of the power amplifier 221 may be connected to the second heat dissipation member 215. Resultantly, the heat generated by the power amplifier 221 may be effectively transferred downwardly of the fan-out semiconductor package module 300A. Metal layers 221b and 221c may be disposed on upper and lower surfaces of the body 221a of the power amplifier 221, respectively. These metal layers 221b and 221c may be utilized as heat radiation members of the power amplifier 221. The metal layer 221c disposed on the lower surface of the body 221a may be used as a ground (GND) layer of the power amplifier 221, and may be connected to the second heat dissipation member 215 through a conductive adhesive 221B including conductive epoxy, a solder, or the like. The number of second electronic components 222 may be plural, and the plurality of second electronic components 222 may be an antenna (S/W), a controller, and/or a bulk acoustic wave (BAW) filter, respectively. The second electronic component 222 may be a surface mounted component, and may be connected to the wiring substrate 210 through bumps 222B including a solder, copper, or the like. The third electronic component 223 may be a capacitor, and the fourth electronic component 224 may be an inductor. The third electronic component 223 and the fourth electronic component 224 may be connected to the wiring substrate 210 through conductive adhesives 223B and 224B including conductive epoxy, a solder, or the like, respectively. As described above, the electronic components 221, 222, 223, and 224 may be front end module (FEM) components for a wearable device, or the like, but are not necessarily limited thereto. Meanwhile, when the electronic components 221, 222, 223, and 224 are these kinds of components and the semiconductor chip 120 is the transceiver IC as described above, the fan-out semiconductor package module 300A according to the embodiment may be used as transceiver complex module.

The second encapsulant 230 may be configured to protect the electronic components 221, 222, 223, and 224. An encapsulation form of the second encapsulant 230 is not particularly limited, but may be a form in which the second encapsulant 230 surrounds at least portions of the electronic components 221, 222, 223, and 224. Material of the second encapsulant 230 is not particularly limited, but may be, for example, an insulating material. For example, the material of the second encapsulant 230 may be the known epoxy molding compound (EMC), or the like, but is not limited thereto.

Figure 11B:
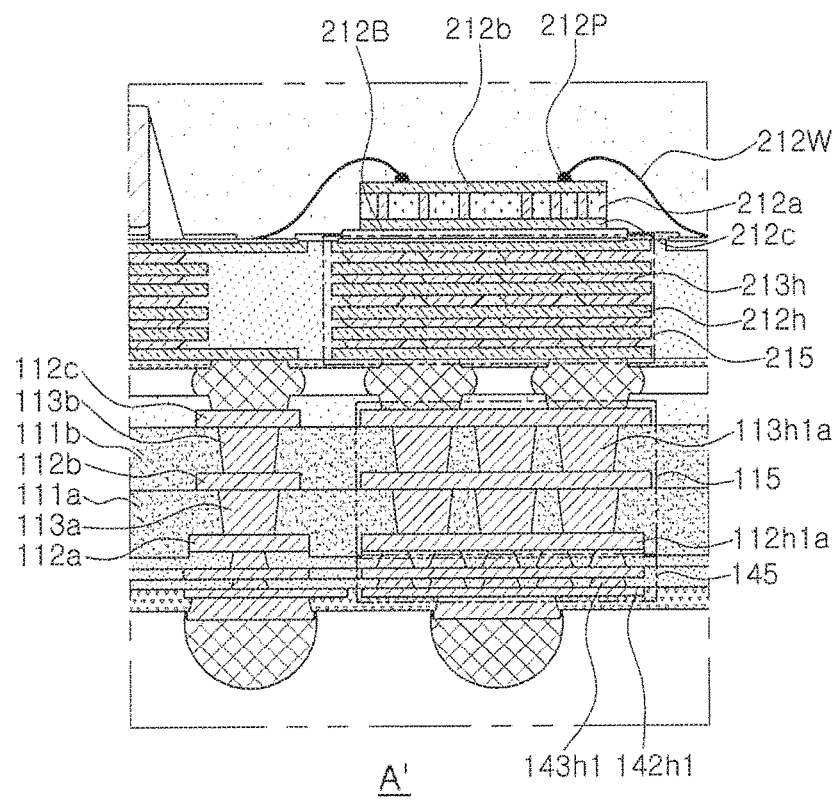
FIGS. 11B and 11C are enlarged views illustrating various modified examples of FIG. 11A.

FIG. 11B is a schematic enlarged view illustrating a modified example of FIG. 11A.

Referring to the drawing, a first connection member 110 may include a first insulating layer 111a in contact with a second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. Since the first connection member 110 may include a large number of redistribution layers 112a, 112b, and 112c, the second connection member 140 may be further simplified. Therefore, a decrease in a yield depending on a defect occurring in a process of forming the second connection member 140 may be suppressed. Since the first redistribution layer 112a is embedded in the first insulating layer 111a, an insulating distance of an insulating layer 141a of the second connection member 140 maybe relatively constant. The first redistribution layer 112a may be recessed into the first insulating layer 111a, such that a lower surface of the first insulating layer 111a may have a step with respect to a lower surface of the first redistribution layer 112a. Resultantly, bleeding of the first encapsulant 130 into the first redistribution layer 112a may be prevented. The first to third redistribution layers 112a, 112b, and 112c may be electrically connected to each other through first vias 113a and 113b each penetrating through the first and second insulating layers 111a and 111b and formed as a multiple layer structure.

The lower surface of the first redistribution layer 112a of the first connection member 110 may be disposed on a level above a lower surface of a connection pad 120P of a semiconductor chip 120. In addition, a distance between a redistribution layer 142 of the second connection member 140 and the first redistribution layer 112a of the first connection member 110 may be greater than that between the redistribution layer 142 of the second connection member 140 and the connection pad 120P of the semiconductor chip 120. Here, the first redistribution layer 112a may be recessed into the first insulating layer 111a. The second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the second redistribution layer 112b formed in the first connection member 110 may be disposed on the level between the active surface and the inactive surface of the semiconductor chip 120.

Thicknesses of the redistribution layers 112a, 112b, and 112c of the first connection member 110 may be greater than those of redistribution layers 142 of the second connection member 140.

Since the first connection member 110 may have a thickness equal to or greater than that of the semiconductor chip 120, the redistribution layers 112a, 112b, and 112c may be formed at large sizes depending on a scale of the first connection member 110. On the other hand, the redistribution layers 142 of the second connection member 140 may be formed at relatively small sizes for thinness.

A first heat dissipation member 115 may include second vias 113h1a formed as a multiple layer structure. For example, the second vias 113h1a may have a form of stacked vias. The second vias 113h1a of each layer may be connected to pads 112h1a for second vias of each layer. For example, the pads 112h1a for second vias may be pads for stacked vias. The conditions for the pitches and the areas described above may also be applied to this case. Other configurations overlap those described above, and a description thereof is thus omitted.

Figure 11C:
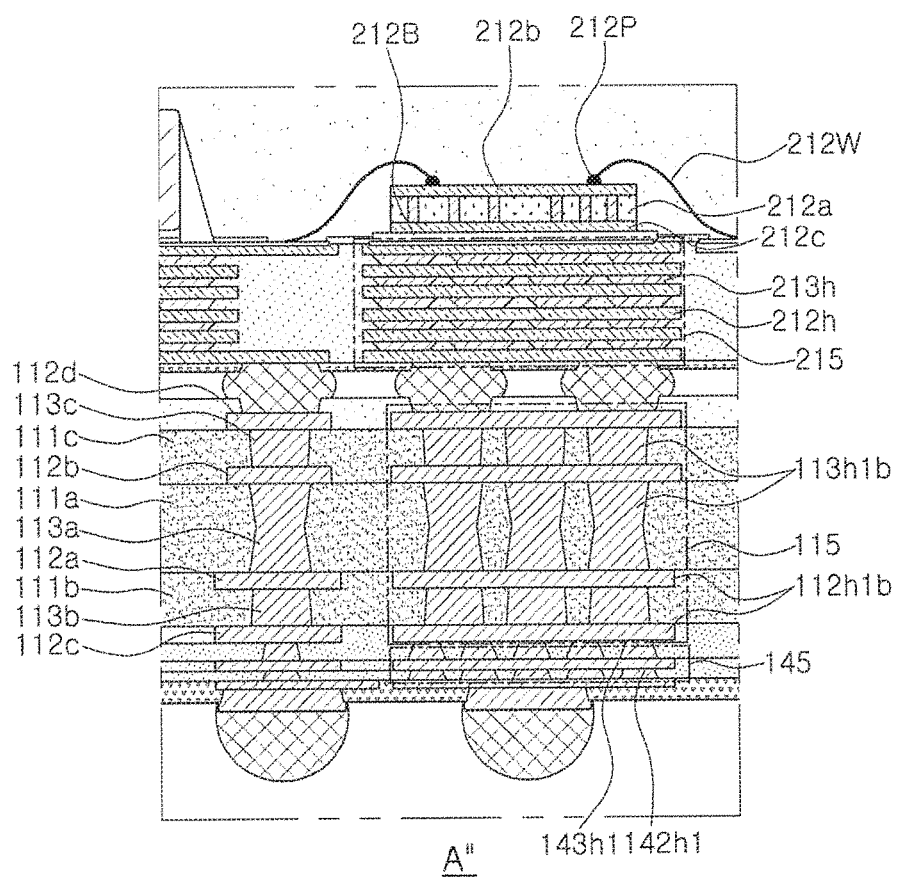

FIG. 11C is a schematic enlarged view illustrating another modified example of FIG. 11A.

Referring to the drawing, a first connection member 110 may include a first insulating layer 111a, a first redistribution layer 112a and a second redistribution layer 112b disposed on lower and upper surfaces of the first insulating layer 111a, respectively, a second insulating layer 111b disposed on the lower surface of the first insulating layer 111a and covering the first redistribution layer 112a, a third redistribution layer 112c disposed on a lower surface of the second insulating layer 111b, a third insulating layer 111c disposed on the upper surface of the first insulating layer 111a and covering the second redistribution layer 112b, and a fourth redistribution layer 112d disposed on an upper surface of the third insulating layer 111c. The first to fourth redistribution layers 112a, 112b, 112c, and 112d may be electrically connected to each other through first vias 113a, 113b, and 113c each penetrating through the first to third insulating layers 111a, 111b, and 111c and formed as a multiple layer structure. Since the first connection member 110 may include a larger number of redistribution layers 112a, 112b, 112c, and 112d, a second connection member 140 may be simplified, such that a decrease in a yield depending on a defect generated in a process of forming the second connection member 140 may be suppressed.

The first insulating layer 111a may have a thickness greater than those of the second insulating layer 111b and the third insulating layer 111c. The first insulating layer 111a may be relatively thick to provide rigidity, and the second and third insulating layers 111b and 111c may be disposed in order to form a larger number of redistribution layers 112c and 112d. The first insulating layer 111a may include an insulating material different from those of the second insulating layer 111b and the third insulating layer 111c. For example, material of the first insulating layer 111a may be prepreg including a glass fiber, an inorganic filler, and an insulating resin, and material of each of the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the vias 113a penetrating through the first insulating layer 111a may have a diameter greater and height higher than those of vias 113b and 113c each penetrating through the second insulating layer 111b and the third insulating layer 111c.

A lower surface of the third redistribution layer 112c of the first connection member 110 may be disposed on a level below a lower surface of a connection pad 120P of a semiconductor chip 120. Distance between a redistribution layer 142 of the second connection member 140 and the third redistribution layer 112c of the first connection member 110 may be smaller than that between the redistribution layer 142 of the second connection member 140 and the connection pad 120P of the semiconductor chip 120. Here, the third redistribution layer 112c may be disposed to protrude on the second insulating layer 111b, resulting in contact with the second connection member 140. The first connection member 110 may be formed at a thickness corresponding to that of the semiconductor chip 120. Therefore, the first redistribution layer 112a and the second redistribution layer 112b formed in the first connection member 110 may be disposed on a level between an active surface and an inactive surface of the semiconductor chip 120.

Thicknesses of the redistribution layers 112a, 112b, 112c, and 112d of the first connection member 110 may be greater than those of redistribution layers 142 of the second connection member 140. Since the first connection member 110 may have a thickness equal to or greater than that of the semiconductor chip 120, the redistribution layers 112a, 112b, 112c, and 112d may also be formed at large sizes. On the other hand, the redistribution layers 142 of the second connection member 140 may be formed at relatively small sizes for thinness.

A first heat dissipation member 115 may include second vias 113h1b formed as a multiple layer structure. For example, the second vias 113h1b may have a mixed form of through-vias and stacked vias. The second vias 113h1b of each layer may be connected to pads 112h1b for second vias of each layer. For example, the pads 112h1b for second vias may be pads for through-vias and stacked vias. The conditions for the pitches and the areas described above may also be applied to this case. Other configurations overlap those described above, and a description thereof is thus omitted.

Figure 12:
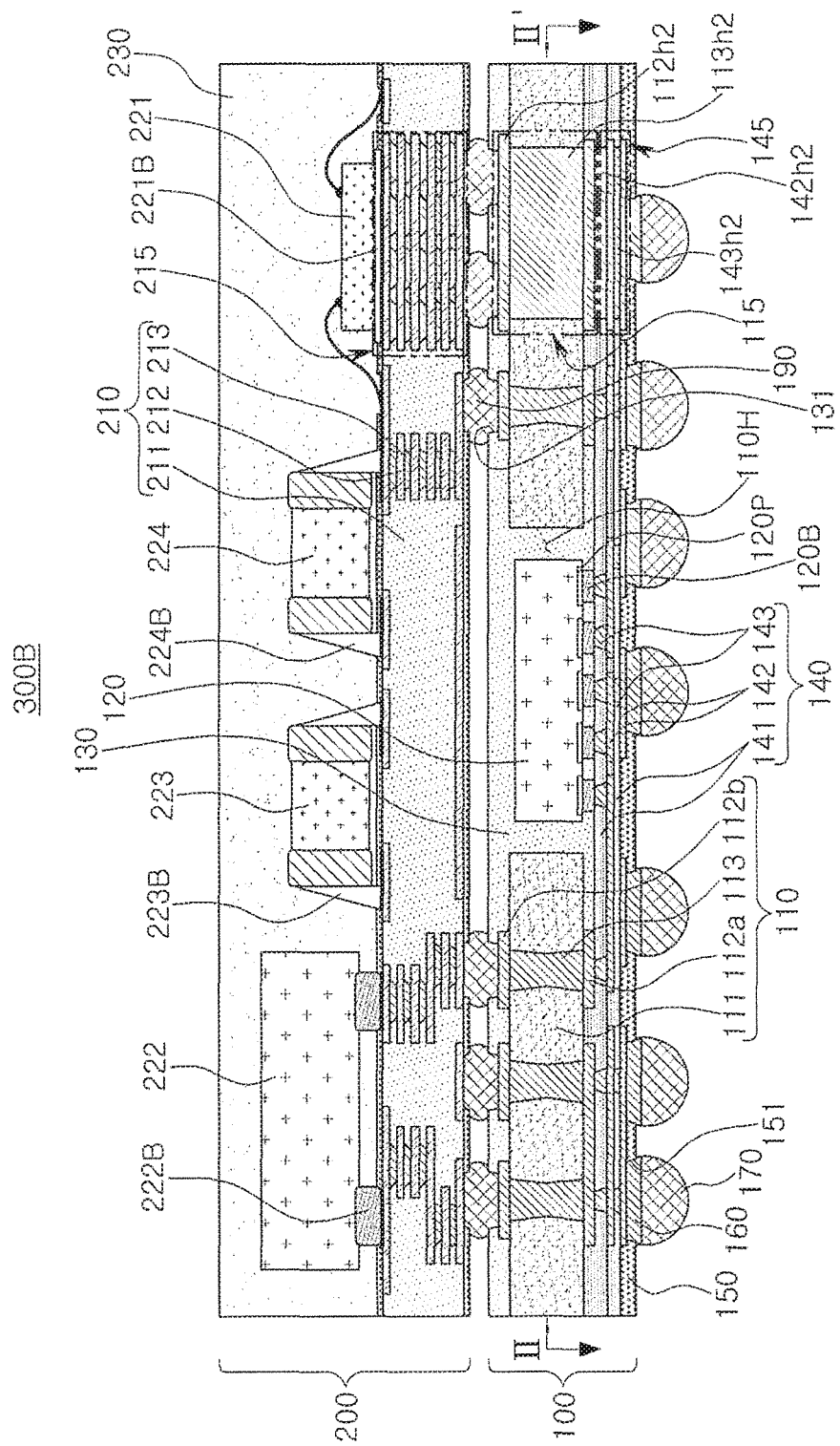
FIG. 12 is a schematic cross-sectional view illustrating another example of a fan-out semiconductor package module.

FIG. 12 is a schematic cross-sectional view illustrating another example of a fan-out semiconductor package module.

Figure 13:
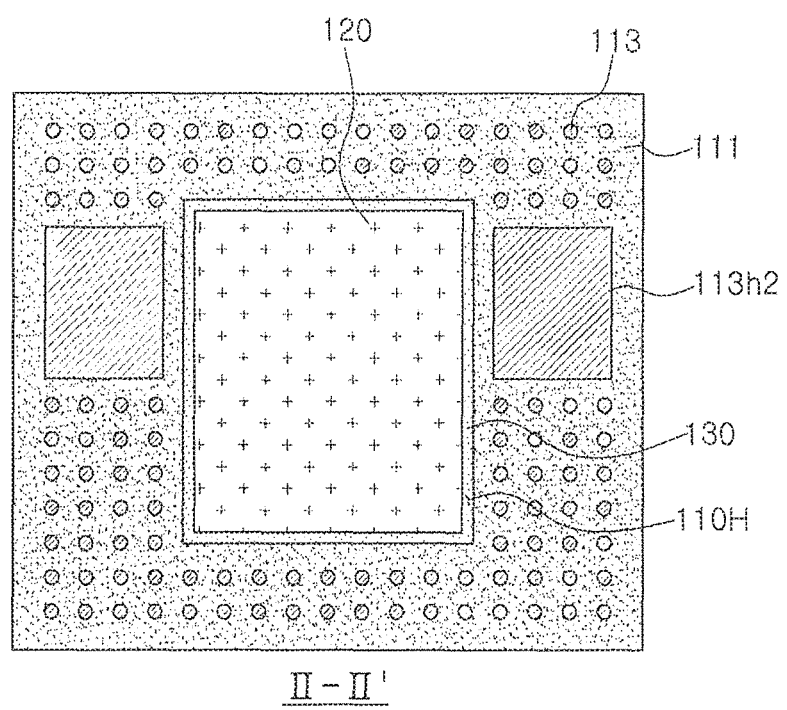
FIG. 13 is a plan view taken along line II-II' of the fan-out semiconductor package module of FIG. 12.

FIG. 13 is a plan view taken along line II-II' of the fan-out semiconductor package module of FIG. 12.

Referring to the drawings, in a fan-out semiconductor package module 300B according to another embodiment in the present disclosure, the first heat dissipation member 115 may include bar-shaped vias 113h2 formed in a first connection member 110 and connected to a second heat dissipation member 215 and a third heat dissipation member 145. The bar-shaped vias 113h2 may be connected to pads 112h2 for bar vias. In addition, the third heat dissipation member 145 may include bar-shaped vias 143h2 formed in a second connection member 140 and connected to the first heat dissipation member 115 and the second heat dissipation member 215. The bar-shaped vias 143h2 may be connected to pads 142h2 for bar vias. As described above, forms of the vias 113h2 and 143h2 of the first heat dissipation member 115 and the third heat dissipation member 145 may be changed. Meanwhile, also in a case in which the bar-shaped vias described above are used, the first connection member 110 may have a form in which it includes multilayer redistribution layers and multilayer vias, as illustrated in FIGS. 11B and 11C. Other configurations overlap those described above, and a description thereof is thus omitted.

Figure 14:
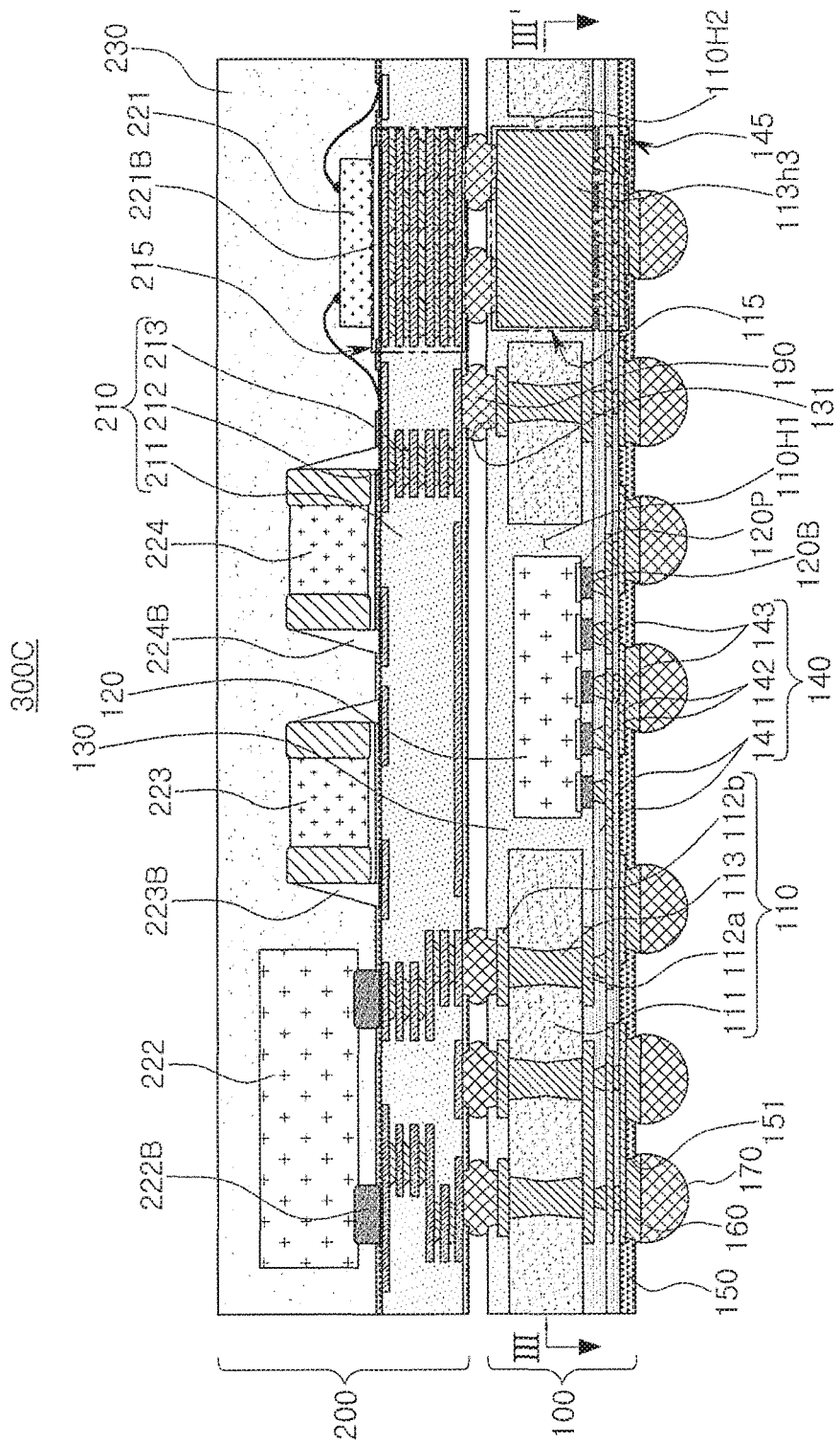
FIG. 14 is a schematic cross-sectional view illustrating another example of a fan-out semiconductor package module.

FIG. 14 is a schematic cross-sectional view illustrating another example of a fan-out semiconductor package module.

Figure 15:
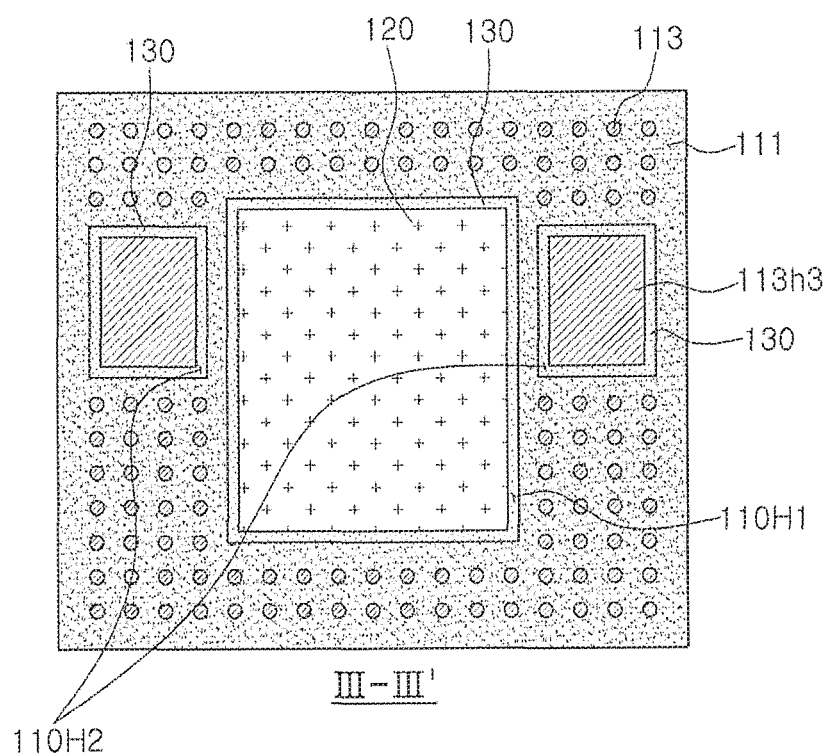
FIG. 15 is a plan view taken along line of the fan-out semiconductor package module of FIG. 14.

FIG. 15 is a plan view taken along line of the fan-out semiconductor package module of FIG. 14.

Referring to the drawings, in a fan-out semiconductor package module 300C according to another embodiment in the present disclosure, the first connection member 110 may include first and second through-holes 110H1 and 110H2, a semiconductor chip 120 may be disposed in the first through-hole 110H1, and a first heat dissipation member 115 may be disposed in the second through-hole 110H2. Here, the first heat dissipation member 115 may include a metal block 113h3 connected to a second heat dissipation member 215 and a third heat dissipation member 145. The metal block 113h3 may be disposed in the second through-hole 110H2, and at least a portion of the metal block 113h3 may be encapsulated by a first encapsulant 130. The metal block 113h3 may include a metal such as, for example, copper, or the like. Additionally, in a case in which the through-holes and the heat dissipation member including the metal block described above are used, the first connection member 110 may have a form in which it includes multilayer redistribution layers and multilayer vias, as illustrated in FIGS. 11B and 11C. Other configurations overlap those described above, and a description thereof is thus omitted.

Figure 16:
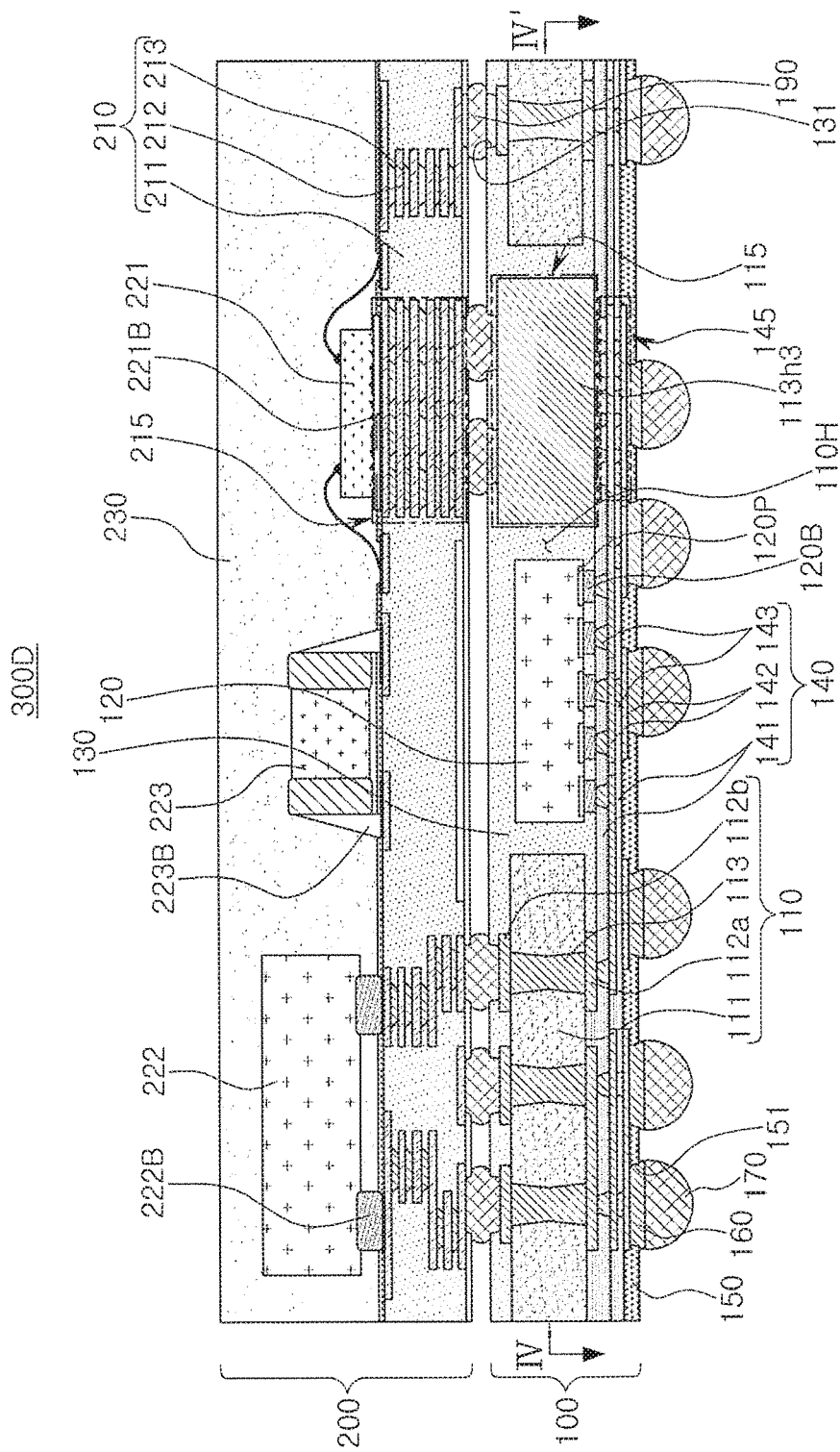
FIG. 16 is a schematic cross-sectional view illustrating another example of a fan-out semiconductor package module.

FIG. 16 is a schematic cross-sectional view illustrating another example of a fan-out semiconductor package module.

Figure 17:
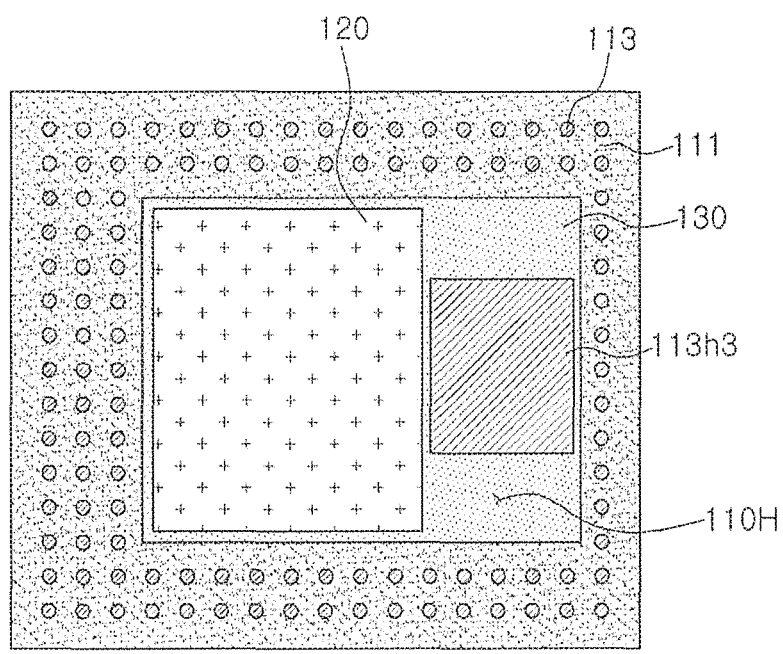
FIG. 17 is a plan view taken along line IV-IV' of the fan-out semiconductor package module of FIG. 16.

FIG. 17 is a plan view taken along line IV-IV' of the fan-out semiconductor package module of FIG. 16.

Referring to the drawing, in a fan-out semiconductor package module 300D according to another embodiment in the present disclosure, a semiconductor chip 120 and a first heat dissipation member 115 may be disposed side by side with each other in a through-hole 110H of a first connection member 110. Here, the first heat dissipation member 115 may include a metal block 113h3 connected to a second heat dissipation member 215 and a third heat dissipation member 145. The metal block 113h3 may be disposed in the through-hole 110H, and at least a portion of the metal block 113h3 may be encapsulated together with the semiconductor chip 120 by a first encapsulant 130. The metal block 113h3 may include a metal such as copper, or the like. Additionally, in a case in which the through-holes and the heat dissipation member including the metal block described above are used, the first connection member 110 may have a form in which it includes multilayer redistribution layers and multilayer vias, as illustrated in FIGS. 11B and 11C. Other configurations overlap those described above, and a description thereof is thus omitted.

Figure 18:
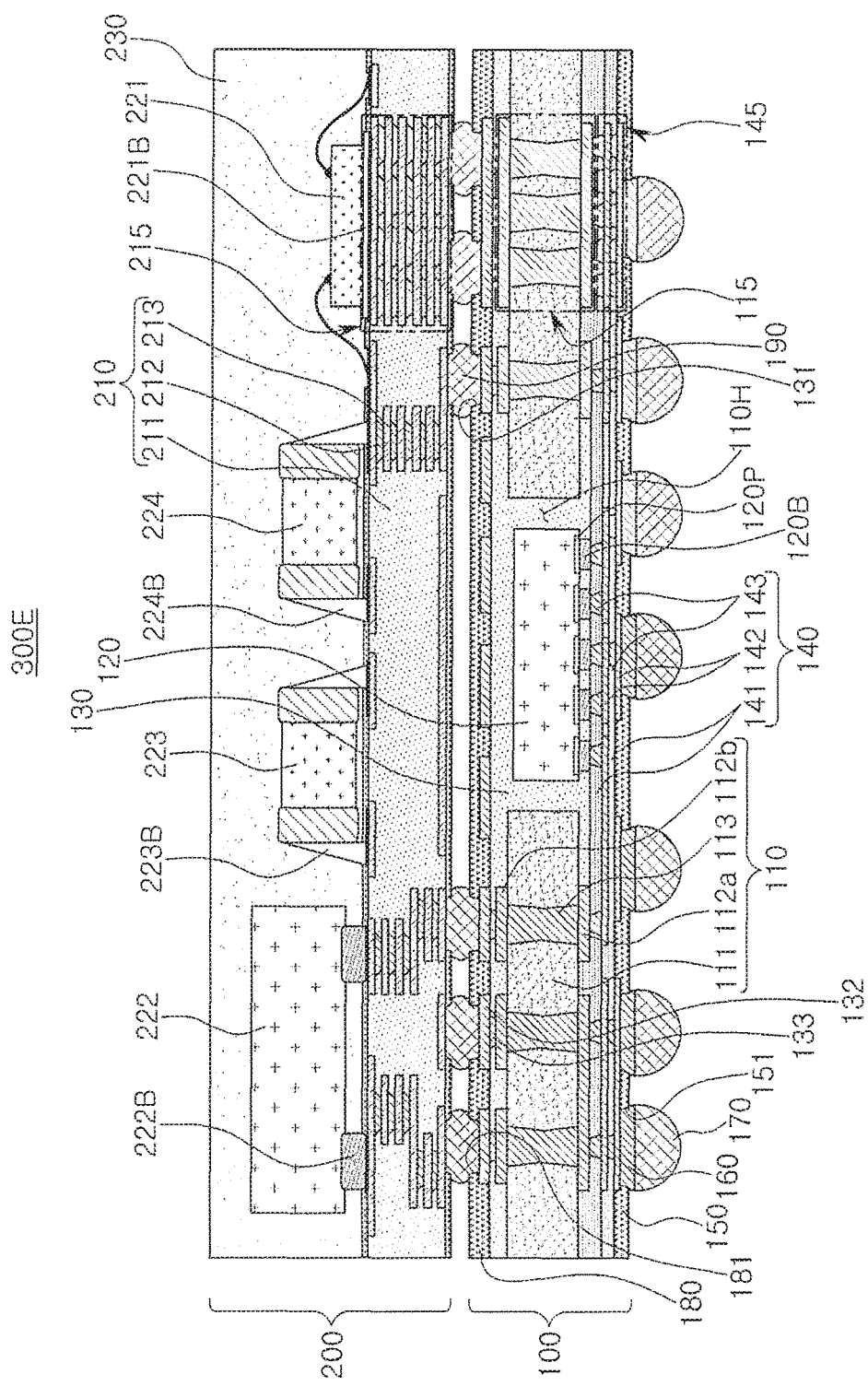
FIG. 18 is a schematic cross-sectional view illustrating another example of a fan-out semiconductor package module.

FIG. 18 is a schematic cross-sectional view illustrating another example of a fan-out semiconductor package module.

Referring to the drawing, in a fan-out semiconductor package module 300E according to another embodiment in the present disclosure, a fan-out semiconductor package 100 may further include a backside redistribution layer 132 disposed on a first encapsulant 130, backside vias 133 penetrating through the first encapsulant 130 and electrically connecting the backside redistribution layer 132 to a first connection member 110, and a passivation layer 180 disposed on the first encapsulant 130 and having openings 181 exposing at least portions of the backside redistribution layer 132. The backside redistribution layer 132 may serve as redistribution patterns. Details of the backside redistribution layer and the backside vias 133 are as described above. The passivation layer 180 may be formed of an insulating material that includes an inorganic filler and an insulating resin, but does not include a glass fiber, for example, ABF, but is not limited thereto. Second connection terminals 190 may be connected to the backside redistribution layer 132 exposed by the openings 181 of the passivation layer 180. As in other embodiments described herein, the first connection member 110 may have a form in which it includes multilayer redistribution layers and multilayer vias, as illustrated in FIGS. 11B and 11C, and the features of the fan-out semiconductor package modules 300B to 300D may be combined with one another. Other configurations overlap those described above, and a description thereof is thus omitted.

Figure 19:
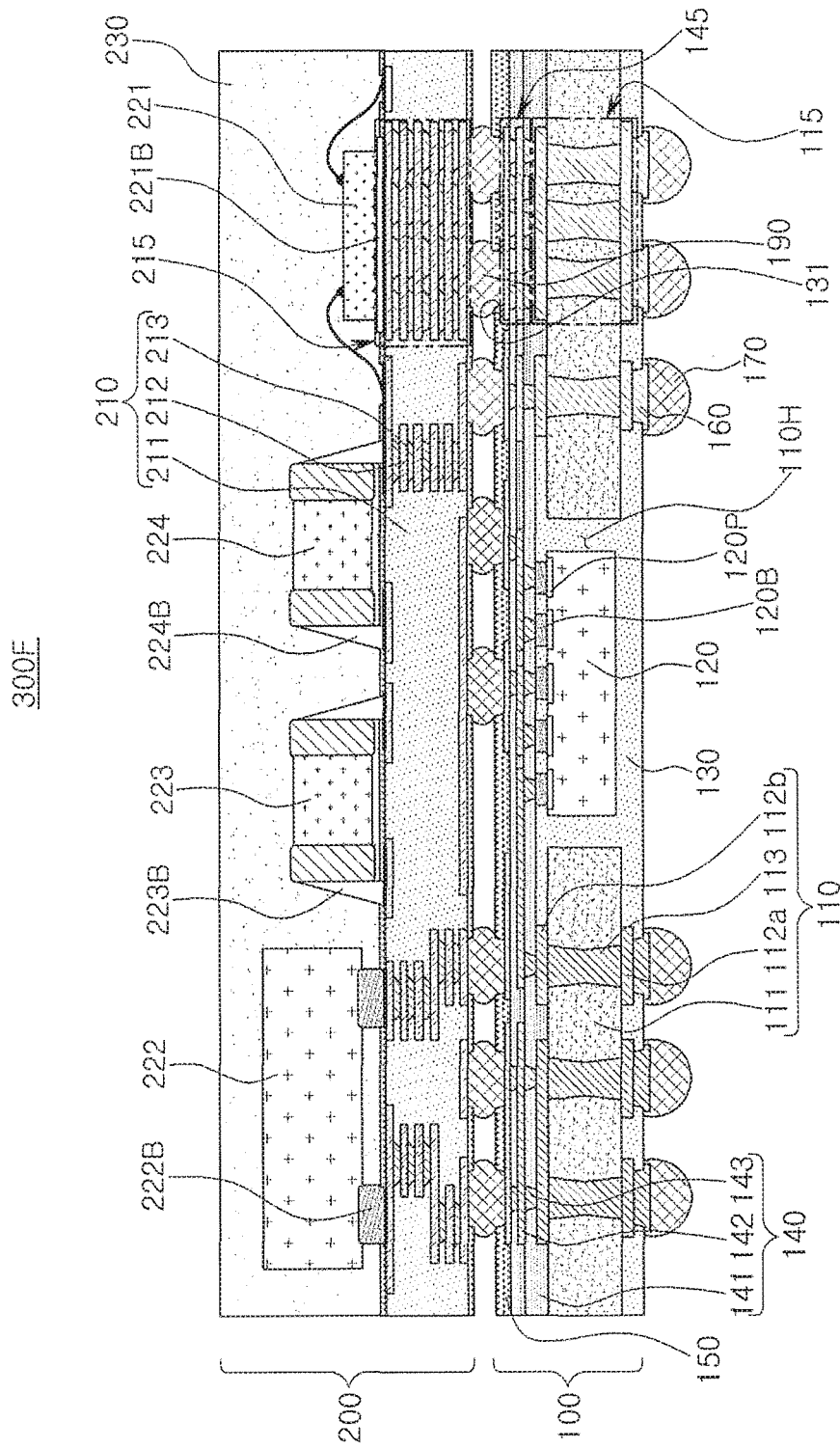
FIG. 19 is a schematic cross-sectional view illustrating another example of a fan-out semiconductor package module.

FIG. 19 is a schematic cross-sectional view illustrating another example of a fan-out semiconductor package module.

Referring to the drawing, in a fan-out semiconductor package module 300F according to another embodiment in the present disclosure, a semiconductor chip 120 of a fan-out semiconductor package 100 may be disposed in a face-up manner. In addition, a second connection member 140 and a passivation layer 150 may be disposed above the semiconductor chip 120, and second connection terminals 190 may be connected to a redistribution layer 142 of the second connection member 140 exposed through openings 151 of the passivation layer 150. Openings 131 may be formed in a lower portion of an encapsulant 130, and an underbump metal layer 160 may be formed in the openings 131. First connection terminals 170 may be connected to the underbump metal layer 160. When the semiconductor chip 120 is disposed in the face-up manner as described above, at least one of connection pads 120P of the semiconductor chip 120 may be connected to at least one of the first connection terminals 170 through the second connection member 140, the second connection terminal 190, a wiring substrate 210, the second connection terminal 190, and the first connection member 110 or through the first connection member 110, the second connection terminal 190, the wiring substrate 210, the second connection terminal 190, and the second connection member 140. In this case, an electrical path between the connection pad 120P of the semiconductor chip 120 and the wiring substrate 210 may be significantly shortened.

In addition, since both of the wiring substrate 210 and the first connection member 110 may redistribute the connection pads 120P, the second connection member 140 may be further simplified. Additionally, since the connection pad 120P and the first connection terminal 170 are connected to each other through the path that is meandering, stress transferred through the first connection terminal 170 is offset through the path, such that reliability, of the via 143 connected to the connection pad 120P may be improved. Further, since the semiconductor chip 120 is disposed in the face-up manner, even though an underfill process for improving reliability of the first connection terminals 170 when the fan-out semiconductor package module 300F is mounted on the main board of the electronic device is performed, the connection pads 120P may be resistant to corrosion due to Cl⁻ ions included in an underfill material. If necessary, a front redistribution layer and front vias may be formed beneath and in the first encapsulant 130, and may be covered with a passivation layer. In this case, the underbump metal layer 160 and the first connection terminals 170 may be connected to the front redistribution layer exposed through openings of the passivation layer, and the front redistribution layer may be formed in both of a fan-in region and a fan-out region and the first connection terminals 170 may thus extend up to the fan-in region as well as the fan-out region. As in other embodiments described herein, the first connection member 110 may have a form in which it includes multilayer redistribution layers and multilayer vias, as illustrated in FIGS. 11B and 11C, and the features of the fan-out semiconductor package modules 300B to 300E may be combined with one another. Other configurations overlap those described above, and a description thereof is thus omitted.

As set forth above, according to embodiments in the present disclosure, a fan-out semiconductor package module a significantly reduced circuit area and improved heat dissipation performance without having a special limitation or a reliability issue may be provided.

While embodiments have been shown and described above, it will be apparent to those skilled in the art that modifications and variations could be made without departing from the scope of the present disclosure as defined by the appended claims.

What is claimed is:

1. A fan-out semiconductor package module comprising:
a fan-out semiconductor package, the fan-out semiconductor package including:
a semiconductor chip having an active surface and an inactive surface opposing the active surface, connection pads being disposed on the active surface,
a first heat dissipation member disposed side by side with the semiconductor chip,
a first encapsulant encapsulating at least portions of the semiconductor chip and at least portions of the first heat dissipation member, and
a connection member disposed below the semiconductor chip and the first heat dissipation member and comprising a redistribution layer electrically connected to the connection pads of the semiconductor chip; and
a component package disposed on the fan-out semiconductor package, the component package comprising:
a wiring substrate disposed on the first encapsulant,
a plurality of electronic components disposed on the wiring substrate,
a second encapsulant encapsulating at least portions of the plurality of electronic components, and
a second heat dissipation member formed in the wiring substrate,
wherein at least one of the plurality of electronic components of the component package is connected to the first heat dissipation member through the second heat dissipation member.

2. The fan-out semiconductor package module of claim 1, wherein the first and second heat dissipation members overlap the at least one electronic component connected to the first and second heat dissipation members when viewed from above.

3. The fan-out semiconductor package module of claim 1, wherein the fan-out semiconductor package further comprises a core member having a through-hole and comprising a redistribution layer electrically connected to the connection pads of the semiconductor chip,
wherein the semiconductor chip is disposed in the through-hole of the first connection member, and
wherein the first heat dissipation member is disposed in the first connection member or the through-hole.

4. The fan-out semiconductor package module of claim 3, wherein the first connection member comprises a plurality of first vias electrically connecting a redistribution layer of the first connection member disposed on one layer to a redistribution layer of the first connection member of a different layer,
the first heat dissipation member comprises a plurality of second vias formed in a region different from a region in which the plurality of first vias are formed in the first connection member and connected to the second heat dissipation member, and
the first plurality of vias and the second plurality of vias are disposed to satisfy the condition: P1>P2, where P1 is a pitch between the plurality of first vias and P2 is a pitch between the plurality of second vias.

5. The fan-out semiconductor package module of claim 4, wherein the first plurality of vias and the second plurality of vias are disposed to satisfy the condition: S1>S2 where S1 is an area of the region in which the plurality of first vias of the first connection member are formed and S2 is an area of the region in which the plurality of second vias are formed.

6. The fan-out semiconductor package module of claim 3, wherein the first heat dissipation member comprises at least one bar-shaped via formed in the first connection member and connected to the second heat dissipation member.

7. The fan-out semiconductor package module of claim 3, wherein the semiconductor chip and the first heat dissipation member are disposed side by side with each other in the through-hole, and
the first heat dissipation member comprises a metal block disposed in the through-hole and connected to the second heat dissipation member.

8. The fan-out semiconductor package module of claim 3, wherein the through-hole comprises a first through-hole in which the semiconductor chip is disposed and a second through-hole in which the first heat dissipation member is disposed, and
the first heat dissipation member comprises a metal block disposed in the second through-hole and connected to the second heat dissipation member.

9. The fan-out semiconductor package module of claim 1, wherein the second heat dissipation member comprises a plurality of stacked vias.

10. The fan-out semiconductor package module of claim 1, wherein the fan-out semiconductor package further comprises a third heat dissipation member formed in the second connection member, and
the third heat dissipation member is connected to the first and second heat dissipation members.

11. The fan-out semiconductor package module of claim 10, wherein the third heat dissipation member comprises a plurality of stacked vias or at least one bar-shaped via.

12. The fan-out semiconductor package module of claim 1, wherein the semiconductor chip comprises a transceiver integrated circuit (IC).

13. The fan-out semiconductor package module of claim 12, wherein the plurality of electronic components comprise a power amplifier (PA) comprising a body having circuits formed therein, connection pads disposed on the body, and vias penetrating through the body,
wherein the connection pads of the power amplifier are electrically connected to the wiring substrate through wire bonding, and
a lower surface of the power amplifier is connected to the second heat dissipation member.

14. The fan-out semiconductor package module of claim 13, wherein a ground layer is disposed on the lower surface of the power amplifier, the ground layer being connected to the second heat dissipation member through a conductive adhesive.

15. The fan-out semiconductor package module of claim 13, wherein the plurality of electronic components further comprise an antenna, a controller, a bulk acoustic wave filter, and
the second heat dissipation member is connected to the power amplifier among the plurality of electronic components.

16. The fan-out semiconductor package module of claim 3, wherein the first connection member comprises
a first insulating layer,
a first redistribution layer in contact with the second connection member and embedded in a first surface of the first insulating layer,
a second redistribution layer disposed on a second surface of the first insulating layer opposing the first surface of the first insulating layer,
a second insulating layer disposed on the first insulating layer and covering the second redistribution layer, and
a third redistribution layer disposed on the second insulating layer,
wherein the first to third redistribution layers are electrically connected to the connection pads.

17. The fan-out semiconductor package module of claim 3, wherein the first connection member comprises
a first insulating layer,
a first redistribution layer disposed on a lower surface of the first insulating layer,
a second redistribution layer disposed on an upper surface of the first insulating layer,
a second insulating layer disposed on the lower surface of the first insulating layer and covering the first redistribution layer,
a third insulating layer disposed on the upper surface of the first insulating layer and covering the second redistribution layer,
a third redistribution layer disposed on a lower surface of the second insulating layer, and
a fourth redistribution layer disposed on an upper surface of the third insulating layer,
wherein the first to fourth redistribution layers are electrically connected to the connection pads.

* * * * *